US010191880B2

(12) United States Patent
Yoshimura et al.

(10) Patent No.: US 10,191,880 B2
(45) Date of Patent: Jan. 29, 2019

(54) SEMICONDUCTOR DEVICE AND INFORMATION PROCESSING DEVICE USING THE TOPOLOGY OF AN ISING MODEL

(71) Applicant: HITACHI, LTD., Chiyoda-ku, Tokyo (JP)

(72) Inventors: Chihiro Yoshimura, Tokyo (JP); Masanao Yamaoka, Tokyo (JP)

(73) Assignee: HITACHI, LTD., Tokyo (JP)

( * ) Notice: Subject to any disclaimer, the term of this patent is extended or adjusted under 35 U.S.C. 154(b) by 137 days.

(21) Appl. No.: 15/122,553

(22) PCT Filed: Mar. 4, 2014

(86) PCT No.: PCT/JP2014/055478
§ 371 (c)(1),
(2) Date: Aug. 30, 2016

(87) PCT Pub. No.: WO2015/132883
PCT Pub. Date: Sep. 11, 2015

(65) Prior Publication Data
US 2017/0068632 A1 Mar. 9, 2017

(51) Int. Cl.
*G06F 13/40* (2006.01)
*G11C 11/16* (2006.01)
(Continued)

(52) U.S. Cl.
CPC ........ *G06F 13/4068* (2013.01); *G06F 1/3296* (2013.01); *G06F 13/28* (2013.01); *G11C 11/16* (2013.01); *G06F 17/5009* (2013.01)

(58) Field of Classification Search
CPC .... G06F 13/4068; G06F 1/3296; G06F 13/28; G06F 17/50; G11C 11/16; G06Q 10/06311
See application file for complete search history.

(56) References Cited

U.S. PATENT DOCUMENTS

2014/0046626 A1 2/2014 Yamamoto et al.
2016/0118106 A1 4/2016 Yoshimura et al.
(Continued)

FOREIGN PATENT DOCUMENTS

WO WO 2012/118064 A1 9/2012
WO WO 2014/192153 A1 12/2014

OTHER PUBLICATIONS

Yoshimura, Chihiro et al.; "Spatial Computing Architecture Using Randomness of Memory Cell Stability under Voltage Control"; Circuit Theory and Design (ECCTD); 2013 European Conference on Sep. 8-12, 2013; pp. 1-4, IEEE.

*Primary Examiner* — Pho M Luu
*Assistant Examiner* — Jerome LeBoeuf
(74) *Attorney, Agent, or Firm* — Miles & Stockbridge PC

(57) ABSTRACT

A semiconductor device in which a ground state of an Ising model is realized, includes a spin array in which a spin unit is formed, the spin unit including a memory cell storing a value of one spin in an Ising model, a memory cell storing an interaction coefficient from an adjacent spin interacting with the spin, a memory cell storing an external magnetic field coefficient of the spin, and a circuit deciding a next state of the spin by binary majority decision logic based on a product of the value of each of the adjacent spins and the corresponding interaction coefficient, and the external magnetic field coefficient. The spin array is formed by having a plurality of the spin units, each having each spin allocated thereto, arranged and connected on a two-dimensional plane on a semiconductor substrate in the state where a topology of the Ising model is maintained.

13 Claims, 26 Drawing Sheets

(51) Int. Cl.
*G06F 1/32* (2006.01)
*G06F 13/28* (2006.01)
*G06F 17/50* (2006.01)

(56) References Cited

U.S. PATENT DOCUMENTS

2017/0083841 A1* 3/2017 Syrichas .......... G06Q 10/06311
2017/0161632 A1* 6/2017 Freedman ............ G06N 99/002
2017/0185380 A1* 6/2017 Hayashi .................. G06F 7/588

* cited by examiner

V'={A, B}
V'＼V={C, D}
w(V') = 2

MEMORY MAP 2000

FIG. 21

DATA 2100

| ADDRESS | BIT 0 | BIT 1 | BIT 2 | BIT 3 | BIT 4 | BIT 5 |
|---|---|---|---|---|---|---|
| | N000 | N001 | N100 | N101 | N200 | N201 |
| 0 | RANDOM | RANDOM | RANDOM | RANDOM | RANDOM | N/A |
| 1 | 0 | 0 | 0 | 0 | 0 | 0 |
| 2 | 0 | 0 | 0 | 0 | 0 | 0 |
| 3 | 0 | 0 | 0 | 0 | 0 | 0 |
| 4 | 0 | 0 | 0 | 0 | 0 | 0 |
| 5 | 0 | 0 | 1 | 1 | 1 | 0 |
| 6 | 0 | 0 | 1 | 1 | 1 | 0 |
| 7 | 1 | 1 | 1 | 0 | 0 | 0 |
| 8 | 1 | 1 | 1 | 0 | 0 | 0 |
| 9 | 1 | 0 | 1 | 1 | 1 | 0 |
| 10 | 0 | 0 | 0 | 1 | 1 | 0 |
| 11 | 1 | 1 | 0 | 0 | 0 | 0 |
| 12 | 0 | 0 | 0 | 0 | 0 | 0 |
| | N010 | N011 | N110 | N111 | N210 | N211 |
| 13 | RANDOM | N/A | RANDOM | RANDOM | RANDOM | N/A |
| 14 | 0 | 0 | 0 | 0 | 0 | 0 |
| 15 | 0 | 0 | 0 | 0 | 0 | 0 |
| 16 | 1 | 0 | 1 | 1 | 1 | 0 |
| 17 | 0 | 0 | 0 | 1 | 1 | 0 |
| 18 | 0 | 0 | 1 | 0 | 0 | 0 |
| 19 | 0 | 0 | 1 | 0 | 0 | 0 |
| 20 | 1 | 0 | 0 | 0 | 0 | 0 |
| 21 | 1 | 0 | 0 | 0 | 0 | 0 |
| 22 | 1 | 0 | 0 | 0 | 1 | 0 |
| 23 | 1 | 0 | 0 | 0 | 1 | 0 |
| 24 | 0 | 0 | 1 | 1 | 0 | 0 |
| 25 | 0 | 0 | 1 | 1 | 0 | 0 |
| | N020 | N021 | N120 | N121 | N220 | N221 |
| 26 | RANDOM | N/A | RANDOM | N/A | RANDOM | N/A |
| 27 | 0 | 0 | 0 | 0 | 0 | 0 |
| 28 | 0 | 0 | 0 | 0 | 0 | 0 |
| 29 | 1 | 0 | 0 | 0 | 1 | 0 |
| 30 | 1 | 0 | 0 | 0 | 1 | 0 |
| 31 | 0 | 0 | 1 | 0 | 1 | 0 |
| 32 | 0 | 0 | 1 | 0 | 1 | 0 |
| 33 | 1 | 0 | 1 | 0 | 0 | 0 |
| 34 | 1 | 0 | 1 | 0 | 0 | 0 |
| 35 | 0 | 0 | 0 | 0 | 0 | 0 |
| 36 | 0 | 0 | 0 | 0 | 0 | 0 |
| 37 | 0 | 0 | 0 | 0 | 0 | 0 |
| 38 | 0 | 0 | 0 | 0 | 0 | 0 |

FIG. 22

DATA 2200

| ADDRESS | BIT 0 | BIT 1 | BIT 2 | BIT 3 | BIT 4 | BIT 5 |
|---|---|---|---|---|---|---|
| | N000 | N001 | N100 | N101 | N200 | N201 |
| 0 | (A) | tmp1 | (B) | tmp2 | tmp3 | N/A |
| 1 | 0 | 0 | 0 | 0 | 0 | 0 |
| 2 | 0 | 0 | 0 | 0 | 0 | 0 |
| 3 | 0 | 0 | 0 | 0 | 0 | 0 |
| 4 | 0 | 0 | 0 | 0 | 0 | 0 |
| 5 | 0 | 0 | 1 | 1 | 1 | 0 |
| 6 | 0 | 0 | 1 | 1 | 1 | 0 |
| 7 | 1 | 1 | 1 | 0 | 0 | 0 |
| 8 | 1 | 1 | 1 | 0 | 0 | 0 |
| 9 | 1 | 0 | 1 | 1 | 1 | 0 |
| 10 | 0 | 0 | 0 | 1 | 1 | 0 |
| 11 | 1 | 1 | 0 | 0 | 0 | 0 |
| 12 | 0 | 0 | 0 | 0 | 0 | 0 |
| | N010 | N011 | N110 | N111 | N210 | N211 |
| 13 | (C) | N/A | (D) | tmp4 | tmp5 | N/A |
| 14 | 0 | 0 | 0 | 0 | 0 | 0 |
| 15 | 0 | 0 | 0 | 0 | 0 | 0 |
| 16 | 1 | 0 | 1 | 1 | 1 | 0 |
| 17 | 0 | 0 | 0 | 1 | 1 | 0 |
| 18 | 0 | 0 | 1 | 0 | 0 | 0 |
| 19 | 0 | 0 | 1 | 0 | 0 | 0 |
| 20 | 1 | 0 | 0 | 0 | 0 | 0 |
| 21 | 1 | 0 | 0 | 0 | 0 | 0 |
| 22 | 1 | 0 | 0 | 0 | 1 | 0 |
| 23 | 1 | 0 | 0 | 0 | 1 | 0 |
| 24 | 0 | 0 | 1 | 1 | 0 | 0 |
| 25 | 0 | 0 | 1 | 1 | 0 | 0 |
| | N020 | N021 | N120 | N121 | N220 | N221 |
| 26 | tmp6 | N/A | tmp7 | N/A | tmp8 | N/A |
| 27 | 0 | 0 | 0 | 0 | 0 | 0 |
| 28 | 0 | 0 | 0 | 0 | 0 | 0 |
| 29 | 1 | 0 | 0 | 0 | 1 | 0 |
| 30 | 1 | 0 | 0 | 0 | 1 | 0 |
| 31 | 0 | 0 | 1 | 0 | 1 | 0 |
| 32 | 0 | 0 | 1 | 0 | 1 | 0 |
| 33 | 1 | 0 | 1 | 0 | 0 | 0 |
| 34 | 1 | 0 | 1 | 0 | 0 | 0 |
| 35 | 0 | 0 | 0 | 0 | 0 | 0 |
| 36 | 0 | 0 | 0 | 0 | 0 | 0 |
| 37 | 0 | 0 | 0 | 0 | 0 | 0 |
| 38 | 0 | 0 | 0 | 0 | 0 | 0 |

FIG. 24

DATA 2400

| ADDRESS | BIT 0 | BIT 1 | BIT 2 | BIT 3 | BIT 4 | BIT 5 |
|---|---|---|---|---|---|---|
| | N000 | N001 | N100 | N101 | N200 | N201 |
| 0 | D | (A) | D | (B) | N/A | C |
| 1 | 0 | 0 | 0 | 0 | 0 | 0 |
| 2 | 0 | 0 | 0 | 0 | 0 | 0 |
| 3 | 0 | 0 | 0 | 0 | 0 | 0 |
| 4 | 0 | 0 | 0 | 0 | 0 | 0 |
| 5 | 0 | 0 | 1 | 1 | 0 | 1 |
| 6 | 0 | 0 | 1 | 1 | 0 | 1 |
| 7 | 1 | 1 | 0 | 1 | 0 | 0 |
| 8 | 1 | 1 | 0 | 1 | 0 | 0 |
| 9 | 0 | 1 | 1 | 1 | 0 | 1 |
| 10 | 0 | 0 | 1 | 0 | 0 | 1 |
| 11 | 1 | 1 | 0 | 0 | 0 | 0 |
| 12 | 0 | 0 | 0 | 0 | 0 | 0 |
| | N010 | N011 | N110 | N111 | N210 | N211 |
| 13 | N/A | (C) | D | (D) | N/A | C |
| 14 | 0 | 0 | 0 | 0 | 0 | 0 |
| 15 | 0 | 0 | 0 | 0 | 0 | 0 |
| 16 | 0 | 1 | 1 | 1 | 0 | 1 |
| 17 | 0 | 0 | 1 | 0 | 0 | 1 |
| 18 | 0 | 0 | 0 | 1 | 0 | 0 |
| 19 | 0 | 0 | 0 | 1 | 0 | 0 |
| 20 | 0 | 1 | 0 | 0 | 0 | 0 |
| 21 | 0 | 1 | 0 | 0 | 0 | 0 |
| 22 | 0 | 1 | 0 | 0 | 0 | 1 |
| 23 | 0 | 1 | 0 | 0 | 0 | 1 |
| 24 | 0 | 0 | 1 | 1 | 0 | 0 |
| 25 | 0 | 0 | 1 | 1 | 0 | 0 |
| | N020 | N021 | N120 | N121 | N220 | N221 |
| 26 | N/A | C | N/A | C | N/A | C |
| 27 | 0 | 0 | 0 | 0 | 0 | 0 |
| 28 | 0 | 0 | 0 | 0 | 0 | 0 |
| 29 | 0 | 1 | 0 | 0 | 0 | 1 |
| 30 | 0 | 1 | 0 | 0 | 0 | 1 |
| 31 | 0 | 0 | 0 | 1 | 0 | 1 |
| 32 | 0 | 0 | 0 | 1 | 0 | 1 |
| 33 | 0 | 1 | 0 | 1 | 0 | 0 |
| 34 | 0 | 1 | 0 | 1 | 0 | 0 |
| 35 | 0 | 0 | 0 | 0 | 0 | 0 |
| 36 | 0 | 0 | 0 | 0 | 0 | 0 |
| 37 | 0 | 0 | 0 | 0 | 0 | 0 |
| 38 | 0 | 0 | 0 | 0 | 0 | 0 |

SEMICONDUCTOR DEVICE AND INFORMATION PROCESSING DEVICE USING THE TOPOLOGY OF AN ISING MODEL

TECHNICAL FIELD

The present invention relates to a semiconductor device which finds a ground state of an Ising model, and particularly to a semiconductor device which simulates spins in an Ising model as CMOS flip-flops, and an information processing device which controls the semiconductor device as an accelerator.

BACKGROUND ART

Currently, the mainstream of computer architectures is the von Neumann model. In the von Neumann architecture, its operation is defined by a program made up of sequential instruction streams. The architecture has versatility that enables use for various purposes by changing the program. Not only CPUs (central processing units) playing the central role of computers, but also computing devices for specific purposes such as GPUs (graphics processing units) are configured with the von Neumann architecture, and their basic operation resides in sequential execution of instruction streams.

Up to now, performance improvement of computers has depended on improvement in clock frequencies. Since the fundamentals of the von Neumann architecture are sequential execution of instruction streams, performance improvement can be expected if the instruction execution speed is increased. However, in general-purpose CPUs used in personal computers and servers, the improvement in clock frequencies leveled off at around 3 GHz in the early 2000s. In recent years, measures which realize performance improvement by multicore-based parallel processing have been the mainstream, instead of the clock frequencies, which leveled off.

In the multicore-based parallel processing, performance can be improved by finding out parts that can be executed in parallel from sequential instruction streams (extraction of parallelism) and executing them in parallel. However, it is not easy to extract parallelism from a program in which sequential algorithms are written as instruction streams. As ILP (Instruction Level Parallelism) which extracts parallelism on the instruction level has already reached its limit, parallelism with coarser granularity such as TLP (Thread Level Parallelism) or DLP (Data Level Parallelism) tend to be used recently.

In view of such circumstances, in order to improve the performance of computers in the future, there is a need to shift to intrinsically parallel information processing rather than the processing based on sequential execution of instruction streams as in the conventional technique. To this end, a problem description method suitable for realizing essentially parallel information processing is needed instead of the conventional problem description method based on sequential instruction streams.

One of candidates for this is the Ising model. The Ising model is a model in statistical mechanics for describing the behavior of magnetic bodies and is used for research on magnetic bodies. An Ising model is defined as interactions between sites (spins taking binary values of +1 and −1). It is known that finding a ground state of an Ising model whose topology is a non-planar graph is an NP-hard problem. Since an Ising model expresses a problem by interaction coefficients spread in spatial directions, there is a possibility that information processing using intrinsic parallelism can be realized.

Incidentally, since finding a ground state of an Ising model is an NP-hard problem as described above, solving the problem with a von Neumann computer involves difficulty in terms of computation time. While an algorithm which achieves a higher speed by introducing a heuristic technique has been proposed, calculation method which directly utilizes physical phenomena instead of a von Neumann computer, that is, a method for finding a ground state of an Ising model at a high speed with an analog computer, has been proposed. For example, the device disclosed in PTL 1 is such a device. In such a device, a degree of parallelism corresponding to the problem to be solved is needed. In the case of the Ising model, elements which realize spins and interactions are needed, corresponding to the number of spins in an Ising model whose ground state should be searched for. For example, in the device disclosed in PTL 1, spins and lasers correspond to each other and therefore lasers in the number proportionate to the number of spins are needed. That is, high scalability that can realize a large number of elements is necessary. Therefore, it is desirable that ground state search of an Ising model can be carried out with solid-state elements such as semiconductor devices in which elements as component units can be realized in the state of being arrayed regularly in a large number. Particularly, a structure which is an array structure represented by a memory device such as DRAM or SRAM and in which component units are simple elements so as enhance integration is desirable.

CITATION LIST

Patent Literature

PTL 1: International Publication No. 2012/118064

SUMMARY OF INVENTION

Technical Problem

It is an object of the invention to realize a semiconductor device in which component elements to be basic component units are arranged in an array in order to find a ground state of an Ising model, using a measure that can be easily manufactured such as CMOS integrated circuit, which is currently the mainstream.

Solution to Problem

In order to solve the foregoing problem, according to the invention, a semiconductor device includes a spin array in which a spin unit is formed, the spin unit including a memory cell storing a value of one spin in an Ising model, a memory cell storing an interaction coefficient from an adjacent spin interacting with the spin, a memory cell storing an external magnetic field coefficient of the one spin, and a circuit deciding a next state of the one spin by binary majority decision logic based on a product of the value of each of the adjacent spins and the corresponding interaction coefficient, and the external magnetic field coefficient. The spin array is formed by having a plurality of the spin units, each having each spin in the Ising model allocated thereto, arranged and connected on a two-dimensional plane on a semiconductor substrate in the state where a topology of the Ising model is maintained.

Also, in order to solve the foregoing problem, according to the invention, in the semiconductor device, a dedicated power supply line is connected to the memory cell storing the value of the spin provided in each spin unit arranged in the spin array, the dedicated power supply line being discriminated from a power supply line which supplies power to the other memory cells and the circuit. In each of the spin units, control to lower a power-supply voltage supplied to the memory cell storing the value of the spin via the dedicated power supply line is performed at the time of executing processing of deciding the next state of the spin.

Also, in order to solve the foregoing problem, according to the invention, in the semiconductor device, the spin array formed by having a plurality of the spin units, each having each spin in the Ising model allocated thereto, arranged and connected on the two-dimensional plane on the semiconductor substrate in the state where the topology of the Ising model is maintained, is configured in such a way that, as each spin unit arranged in the spin array, each spin unit having a spin of each lattice vertex allocated thereto is arranged on the semiconductor substrate, with each lattice vertex in a lattice vertex arrangement in a Z-axis direction being inserted between each space in a lattice vertex arrangement in an X-axis direction, and with a lattice vertex arrangement in a Y-axis direction being a similar arrangement, as a method for arranging each lattice vertex of an Ising model of a three-dimensional lattice on the two-dimensional plane, and with the respective spin units being wire-connected to each other in the state where the topology of the three-dimensional lattice is maintained.

Moreover, in order to solve the foregoing problem, according to the invention, an information processing device includes a CPU, a RAM, an HDD, and a semiconductor device applicable as an accelerator, connected to a system bus. The semiconductor device includes: a spin array in which a spin unit is formed, the spin unit including a memory cell storing a value of one spin in an Ising model, a memory cell storing an interaction coefficient from an adjacent spin interacting with the spin, a memory cell storing an external magnetic field coefficient of the one spin, and a circuit deciding a next state of the one spin by binary majority decision logic based on a product of the value of each of the adjacent spins and the corresponding interaction coefficient, and the external magnetic field coefficient, the spin array being formed by having a plurality of the spin units, each having each spin in the Ising model allocated thereto, arranged and connected on a two-dimensional plane on a semiconductor substrate in the state where a topology of the Ising model is maintained; an I/O interface which reads from and writes into the memory cells of the spin units arranged in the spin array; and an interaction control interface which supplies a signal enabling an interaction, for each group, to the spin units that are grouped. A control program of the semiconductor device executed on the CPU generates an interaction coefficient and an external magnetic field coefficient of an Ising model which expresses a target problem, decides allocation of each spin in the Ising model to the spin units in the spin array on the semiconductor device, randomly generates an initial spin arrangement, writes the initial spin arrangement, the interaction coefficient and the external magnetic field coefficient into the spin units in the spin array on the semiconductor device with each spin in the Ising model allocated thereto, executes ground state search processing on the spin units that are grouped, repeatedly a predetermined number of times, and reads out the spin arrangement of the spin unit that has reached a ground state, and thus acquires a solution to the target problem.

Advantageous Effects of Invention

According to the invention, a semiconductor for finding a ground state of an Ising model which can be manufactured by a CMOS integrated circuit process currently in widespread use can be provided. Moreover, ground state search can be performed adaptively to process variations of devices generated in the semiconductor manufacturing process.

BRIEF DESCRIPTION OF DRAWINGS

FIG. 21 is a view explaining an example of data to be written in an Ising chip in order to cause ground state search of an Ising model to be performed.

FIG. 22 is a view explaining an example of data read out from an Ising chip after the Ising chip carries out ground state search of an Ising model by the Ising chip.

FIG. 24 is a view explaining an example of data to be written in an Ising chip in order to cause ground state search of an Ising model to be performed.

DESCRIPTION OF EMBODIMENTS

Hereinafter, examples will be described using the drawings.

Example 1

In this example, an example of an Ising chip 100 which is a semiconductor device finding a ground state of an Ising model, and an information processing device 200 which controls the Ising chip 100, will be described.

(1) Transform Problem to be Solved into Ground State Search Problem of Ising Model The Ising model is a model in statistical mechanics for describing the behavior of magnetic bodies. An Ising model is defined by spins taking binary values of +1 and −1 (or 0 and 1, up and down), an interaction coefficient indicating an interaction between spins, and an external magnetic field coefficient existing for each spin.

An Ising model can calculate the energy at the time on the basis of a spin arrangement, interaction coefficient and external magnetic field coefficient that are provided. The energy function (Eσ) of an Ising model is generally expressed by the following equation (Math. 1). Here, $\sigma_i$ and $\sigma_j$ represent the values of the i-th and j-th spins, respectively, $J_{i,j}$ represents the interaction coefficient between the i-th and j-th spins, $h_i$ represents the external magnetic field coefficient to the i-th spin, <i, j> represents the combination of two adjacent sites, and σ represents the arrangement of spins.

[Math. 1]

$$E(\sigma) = -\sum_{\langle i,j \rangle} J_{i,j}\sigma_i\sigma_j - \sum_i h_i\sigma_i \quad \text{(Math. 1)}$$

Finding a ground state of an Ising model is an optimization problem to find a spin arrangement that minimizes the energy function of the Ising model.

For example, a problem which seems to be unrelated to magnetic bodies, such as factorization or a travelling salesman problem, can be transformed into an Ising model. Then, the ground state of the Ising model obtained by the transformation corresponds to the solution to the original problem. Based on this, it can be said that a device which can search for the ground state of an Ising model is a computer applicable for general purposes.

Figure 11:
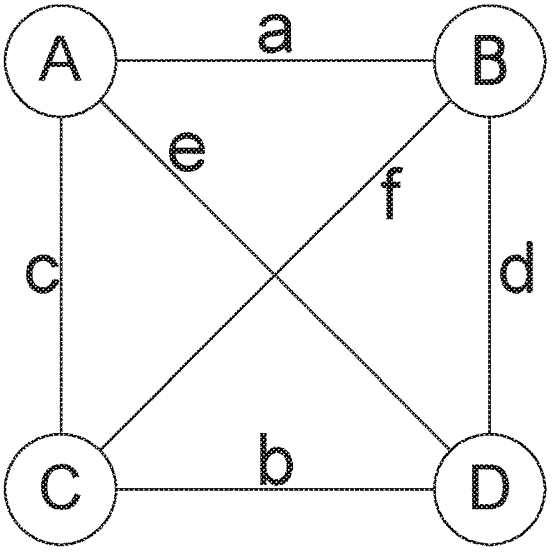
FIG. 11 is a view explaining an example of a graph problem which an Ising chip solves.

In this example, a maximum cut problem in a graph will be described as a problem example, in order to explain an example in its entirety from the problem to be solved to the setting of an Ising chip. First, a graph will be explained using FIG. 11. The graph G=(V, E) in FIG. 11 is made up of a set of vertices V={A, B, C, D} and a set of sides E={a, b, c, d, e, f}. Each side has a weight coefficient and it is assumed that the description of a, b, c, d, e, f expresses the weight coefficient.

Figure 12:
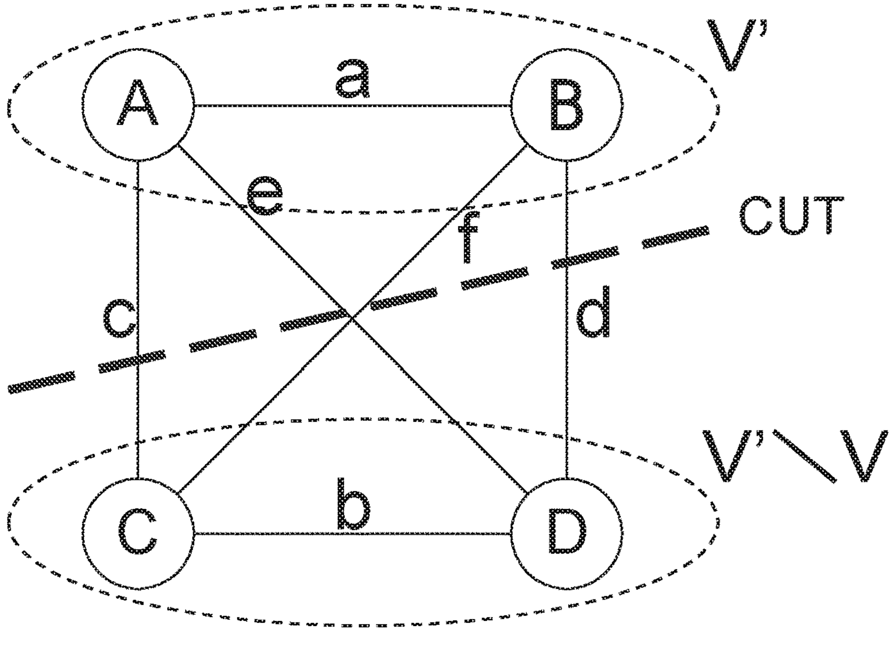
FIG. 12 is a view explaining an example of a graph problem which an Ising chip solves.

As shown in FIG. 12, dividing the vertices V in this graph into two subsets V' and V'\V is called a cut. V'\V represents the set V excluding V'. Here, the sides laid between the divided V' and V'\V (in the example of FIG. 12, *c, d, e, f*) are called edges crossing the cut or cut edges. In the case of a graph with no weights, the number of cut edges, and in the case of a graph with weights as in FIG. 12, the sum of the weights of the cut edges, is called the magnitude of the cut. In the example of FIG. 12, the magnitude of the cut is c+d+e+f.

While FIGS. 11 and 12 show an example of an undirected graph, it may be extended to a directed graph.

The maximum cut problem is finding a cut which maximizes the magnitude of the cut when the graph G=(V, E) is provided. In other words, it can be said that the set of vertices V is grouped into V' and V'\V in such a way as to maximize the magnitude of the cut.

Figure 13:
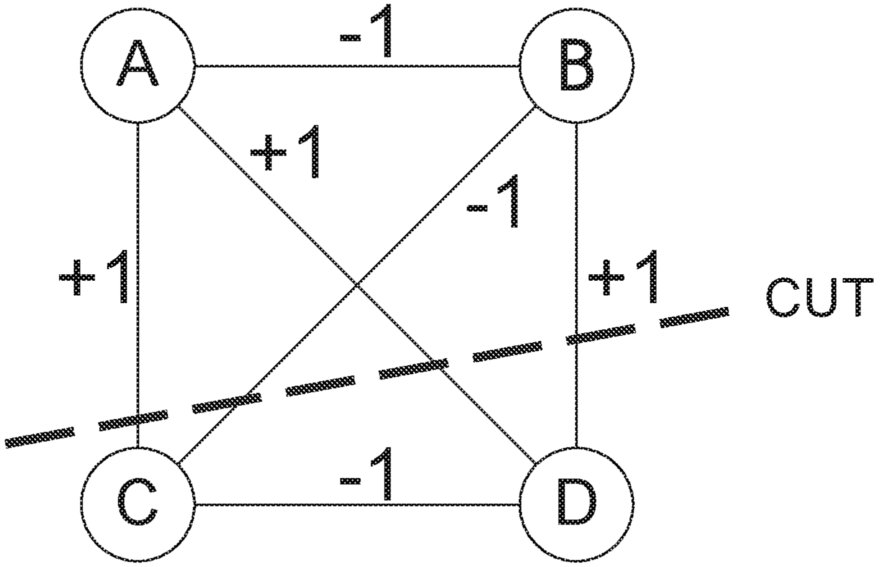
FIG. 13 is a view explaining an example of a graph problem which an Ising chip solves.

A specific example of the maximum cut problem is shown in FIG. 13. In this example, when a cut is performed in such a way as to divide the vertices V into V'={A, B} and V'\V={C, D}, the magnitude of the cut is w (V')=2, resulting in the maximum cut in this graph.

Back to FIG. 12, the relation between the cut in the graph and the Ising model will be described. In the graph of FIG. 12, the magnitude of the cut is w (V')=c+d+e+f. Here, if the graph of the FIG. 12 is regarded as an Ising model, the weights of the sides E={a, b, c, d, e, f} are the interaction coefficients in the Ising model. Then, the vertices V={A, B, C, D} are spins having binary states of +1 and −1, respectively, in the Ising model. Here, the vertices belonging to the vertices V' resulting from the cut have spins of +1, and the vertices belonging to V'\V have spins of −1. That is, A=+1, B=+1, C=−1 and D=−1 hold. The energy in the Ising model in this case is −(a+b−c−d−e−f)=a−b+c+d+e+f if calculated on the basis of the energy function shown in Math. 1. Incidentally, since the magnitude of the cut is w(V')=c+d+e+f, this energy function can be expressed as in Math. 2.

[Math. 2]

$$E(\sigma) = -\left(\sum_{\langle i,j \rangle} J_{i,j} - 2w(V')\right) \quad \text{(Math. 2)}$$

If specifically calculated on the basis of the example of FIG. 12, it will be confirmed that −((a+b+c+d+e+f)−2(c+d+e+f))=−(a+b−c−d−e−f) holds. From Math. 2, it can be understood that the energy E(σ) increases if the magnitude of the cut w(V') is maximized. That is, if the magnitude of the cut is maximized, the energy in the Ising model is maximized. In contrast, if the magnitude of the cut is minimized, the energy in the Ising model is minimized. That is, ground state search of an Ising model corresponds to finding a minimum cut. Thus, in order to find a minimum cut, all the signs of the weights in the maximum cut problem are reversed, thus transforming the problem into finding a minimum cut.

It is known that a minimum cut problem is efficiently calculated by the Ford-Fulkerson algorithm on the basis of the max-flow min-cut theorem, as long as all the signs of the weights are positive. However, if the signs of the weights in a maximum cut problem are reversed to create a minimum cut problem, negative weights are included in many cases and therefore the Ford-Fulkerson algorithm cannot be applied. Also, while there is an approximate solution method using semidefinite programming for a maximum cut problem where all the signs of the weights are positive, this is limited to positive weights. In contrast, if a maximum cut problem or a minimum cut problem is expressed by ground state search of an Ising model, it does not matter whether the weights are positive or negative.

Figure 14:
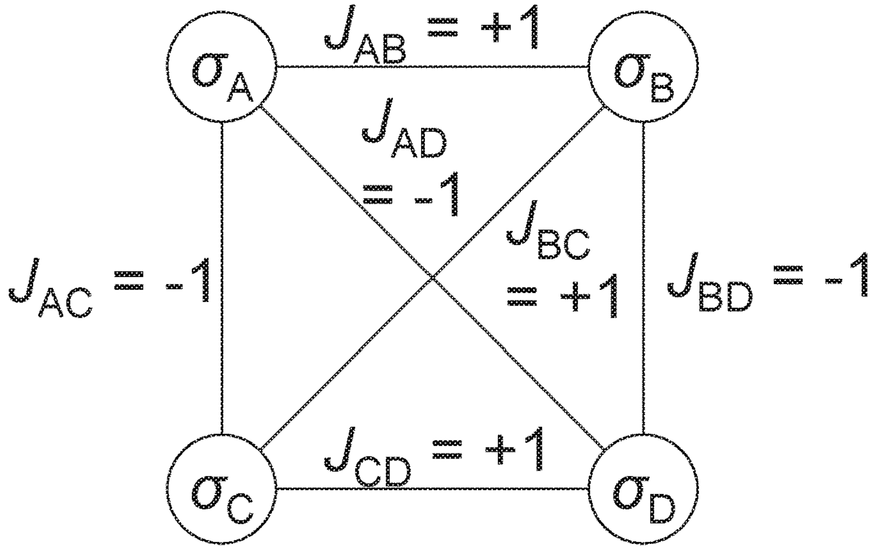
FIG. 14 is a view explaining an example of an Ising model corresponding to a graph problem.
Figure 15:
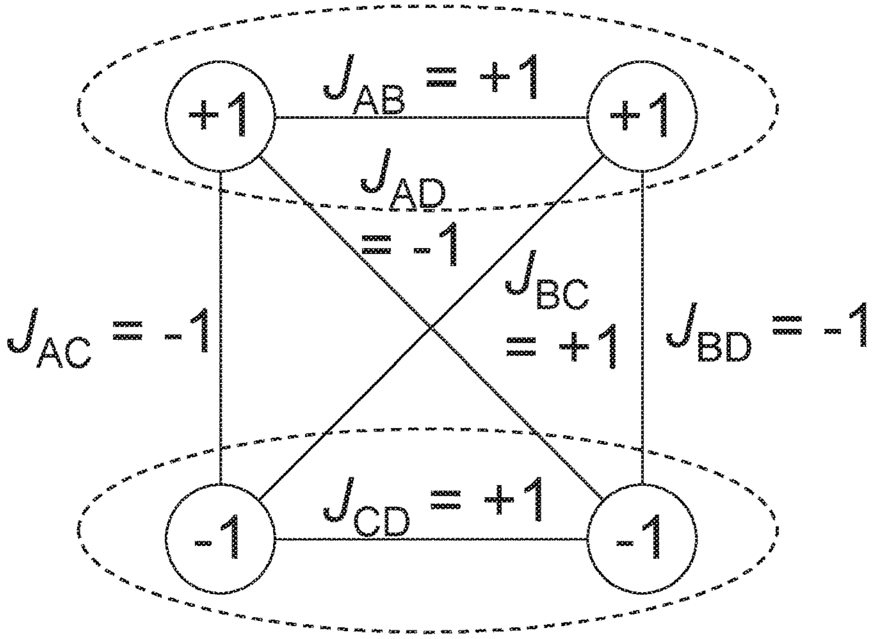
FIG. 15 is a view explaining an example of an Ising model corresponding to a graph problem.

An example in which the maximum cut problem shown in FIG. 13 is transformed into a ground state search problem of an Ising model is shown in FIG. 14. It can be seen that interaction coefficients $J_{AB}$, $J_{AC}$, $J_{AD}$, $J_{BC}$, $J_{BD}$, $J_{CD}$ provided on the individual sides in FIG. 14 are those with the signs of the weights in FIG. 13 reversed. This corresponds to the transformation of a maximum cut problem to a minimum cut problem described above. Then, the result of searching for the ground state of the Ising model of FIG. 14 and deciding spins $\sigma_A$, $\sigma_B$, $\sigma_C$, $\sigma_D$ in such a way as to minimize the energy is shown in FIG. 15. In the example of FIG. 15, $\sigma_A=+1$, $\sigma_B=+1$, $\sigma_C=-1$ and $\sigma_D=-1$ hold. However, in an Ising model, since reversing the states of all the spins results in the same energy, $\sigma_A=-1$, $\sigma_B=-1$, $\sigma_C=+1$ and $\sigma_D=+1$ represent a ground state as well. In the example of FIG. 15, the vertices belonging to the cut V' have the spin value of +1 and the vertices belonging to V'\V have the spin value of −1. By thus performing ground state search of the Ising model and grouping the vertices according to their spin values, a maximum cut or a minimum cut can be realized.

Here, a device which realizes ground state search of an Ising model as shown in FIG. 14 and a control method for the device will be described according to the invention. Since it is known that finding a ground state of an Ising model whose topology is a non-planar graph is an NP-hard problem, as described above, an example of a device which realizes ground state search of an Ising model of a three-dimensional lattice will be described. However, the invention is not limited to an Ising model of a three-dimensional lattice and can be applied to an arbitrary topology and an arbitrary number of spins.

(2) Configuration of Ising Chip

Figure 1:
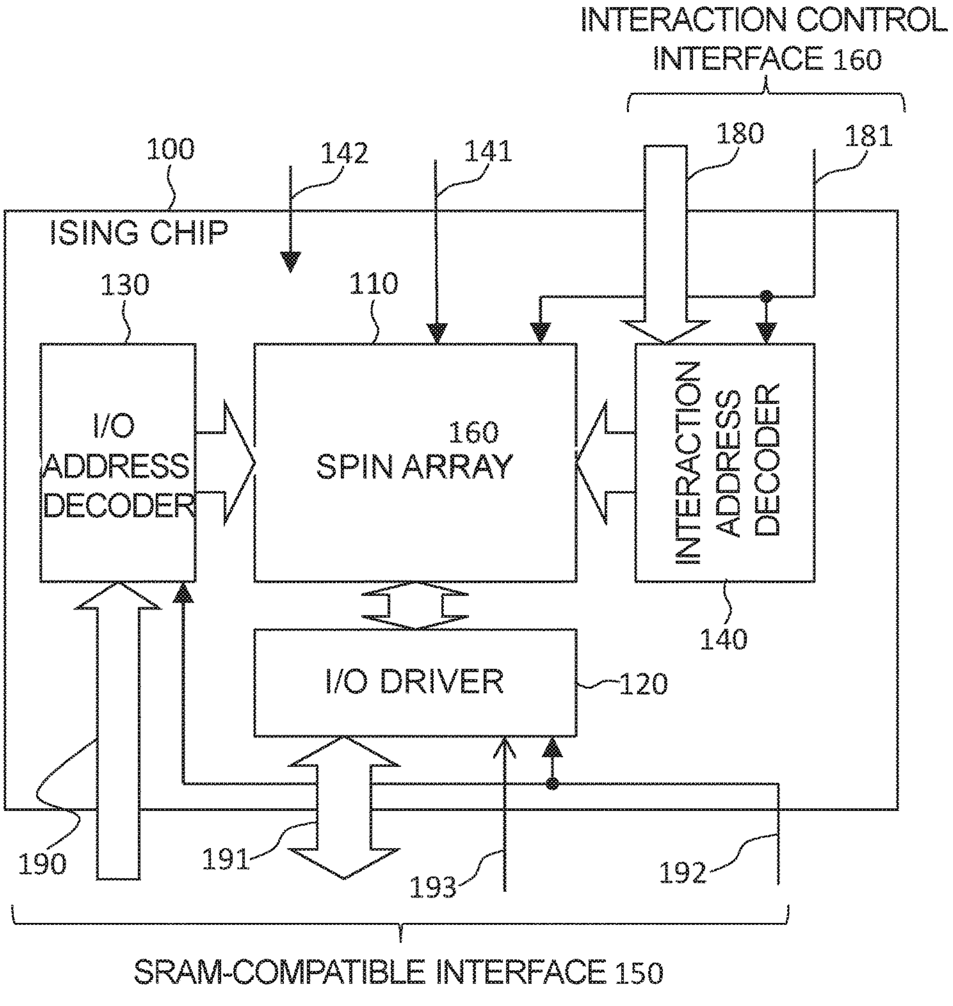
FIG. 1 is a view explaining an example of the configuration of an Ising chip as a semiconductor device of the invention.

FIG. 1 is an example of the configuration of the Ising chip 100 in this example. The Ising chip 100 is made up of a spin array 110, an I/O driver 120, an I/O address decoder 130, and an interaction address decoder 140. In this example, it is assumed that the Ising chip 100 is installed as a CMOS integrated circuit, which is currently in widespread use. However, the Ising chip 100 can also be implemented by other solid-state elements. The Ising chip 100 has an SRAM-compatible interface 150 for reading from and writing to the spin array 110, including an address bus 190, a data bus 191, a R/W control line 193, and an I/O clock 192. Also, the Ising chip 100 has an interaction address 180 and an interaction clock 181, as an interaction control interface 160 for controlling ground state search of an Ising model. The Ising chip 100 operates with a voltage supplied via a normal power supply line 142. However, a part of the spin array 110 operates with a voltage supplied via a spin power supply line 141. Specifically, of memory cells provided in a spin unit 300 (FIG. 3) forming the spin array 110, a memory cell N which holds spin information operates with the voltage supplied via the spin power supply line 141.

In the Ising chip 100, all of the spins $\sigma_i$, the interaction coefficients $J_{i,j}$, and the external magnetic field coefficients $h_i$ of the Ising model are expressed by information stored in the memory cells in the spin array 110. In order to set an initial state of the spins and read out a solution after the completion of ground state search, reading/writing of the spins $\sigma_i$ is carried out on the SRAM-compatible interface 150. Also, in order to set an Ising model whose ground state should be searched for to the Ising chip 100, reading/writing of the interaction coefficients $J_{i,j}$ and the external magnetic field coefficients $h_i$ is carried out on the SRAM-compatible interface 150 as well. Therefore, the spins $\sigma_i$, the interaction coefficients $J_{i,j}$, and the external magnetic field coefficients $h_i$ in the spin array 110 are given addresses. The address bus 190, the data bus 191 and the R/W control line 193 forming the SRAM-compatible interface 150 operate synchronously with a clock inputted by the I/O clock 192. However, in the invention, the interface need not be synchronous and may be an asynchronous interface. In this example, it is assumed to be a synchronous interface.

Also, the Ising chip 100 realizes interactions between the spins inside the spin array 110 in order to perform ground state search. It is the interaction control interface 160 that controls these interactions from outside. Specifically, an address which designates an interacting spin group is inputted by the interaction address 180, and the interaction is carried out synchronously with a clock inputted by the interaction clock 181. However, the interaction need not necessarily be implemented by a clock synchronous circuit and may be implemented by an asynchronous circuit. In such a case, the role of the interaction clock 181 is not to input a clock but to input an enable signal which enables the execution of the interaction. The interaction control interface need not necessarily be synchronous, either, and may be an asynchronous interface. However, in this example, it is assumed that, using a synchronous interface, the interaction is performed synchronously with the interaction clock 181.

(3) Adaptation to Process Variations of Memory Cells in Spin Array

In the Ising chip 100, the spin array 110 has a large number of spin units 300 (described in detail later), thus realizing high parallelism. When spatial parallelism among a large number of spin units is utilized in this manner, it is necessary to adapt to variations of characteristics generated in the larger number of component elements. As the adaptation to such process variations, adding a circuit for absorbing process variations to the device and adjusting a circuit constant such as resistance value in the circuit so as to adapt to individual differences may be considered, for example. There is also a method in which a plurality of devices (transistors) are connected in parallel, thus averaging individual differences. In either case, a circuit or device is added or its redundancy is provided in order to adapt to individual differences, with the side effect of leading to an increase in circuit scale.

Particularly, if a large number of component elements are to be arrayed in order to enhance the degree of parallelism, the influence of process variations increases in proportion to the number of component elements. Moreover, in the case of a semiconductor device, the refinement of the semiconductor process that is necessary for increasing the degree of integration causes an increase of process variations. Meanwhile, the adaptation to process variations by adding a circuit, as described above, complicates the internal structures of the component elements to be basic component units and ends up lowering scalability. That is, there is an antinomy that if scalability is to be enhanced, the influence of process variations increases, whereas if adaptation to process variations is to be achieved, scalability is lowered.

Also, the invention employs a configuration in which random behavior caused by lowering a power-supply voltage supplied to the memory cell in the spin unit 300 is utilized, as described later. The reason for employing such a configuration is mainly the influence of process variations Thus, according to the invention, as described later, ground state search is performed, changing the correspondence between spins in an Ising model to be solved and the spin units 300 in the spin array 110. Thus, adaptation to process variations is realized while minimizing the complication of hardware. By this, high scalability is realized.

(4) Configuration of Information Processing Device

Figure 2:
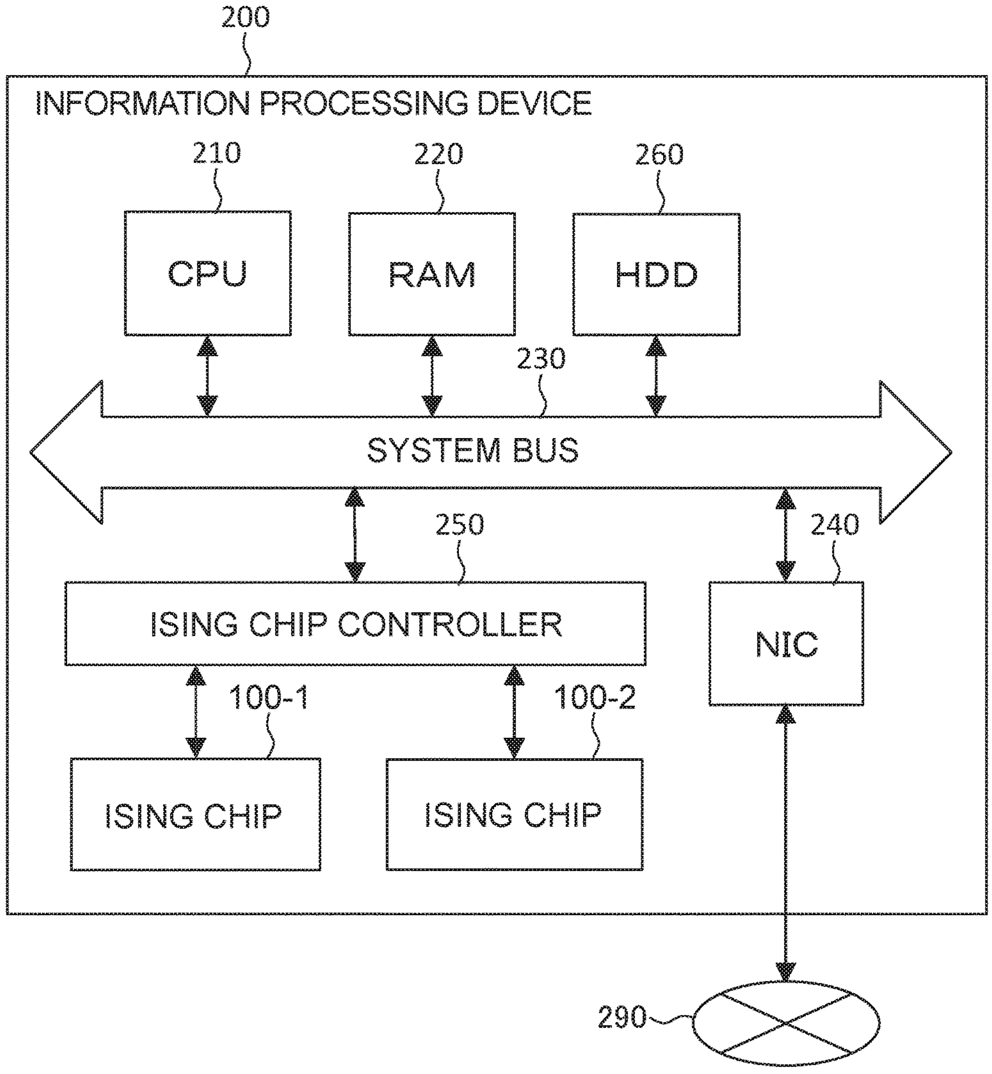
FIG. 2 is a view explaining an example of the configuration of an information processing device which controls an Ising chip as a semiconductor device of the invention.

Information processing is realized, using one or a plurality of such Ising chips 100. To this end, the interface as described above must be controlled. For this, the Ising chip 100 is used as a part of an information processing device 200 as shown in FIG. 2.

The information processing device 200 may be considered to be a device such as a personal computer or server that is commonly used at present, with an accelerator made up of the Ising chip 100 installed therein. The information processing device 200 has a CPU 210, a RAM 220, an HDD 260, and an NIC 240, and these are connected via a system bus 230. This is a configuration that is commonly seen in personal computers and servers at present. In addition, an Ising chip controller 250 is connected to the system bus 230, and one or a plurality of Ising chips are provided beyond the Ising chip controller 250 (in the example of FIG. 2, two Ising chips 100-1 and 100-2, and hereinafter, when there is no particular need to distinguish between the two Ising chips, these Ising chips are simply referred to as the Ising chips 100). The Ising chip controller 250 and the Ising chips 100 are equivalent to an accelerator, which takes the form of an extension card to be inserted for use in a peripheral extension interface such as PCI Express, for example. The Ising chip controller 250 converts the protocol of the system bus 230 (for example, PCI Express or QPI) according to the interface of the Ising chips. The software operating on the CPU 210 of the information processing device 200 can control the Ising chips 100 via the Ising chip controller 250, generally by reading from and writing to a specific address (so-called MMIO (Memory Mapped I/O)). Also, a plurality of such information processing devices may be connected via an inter-device network 290 and used in this form.

(5) Configuration of Spin Array

Figure 5:
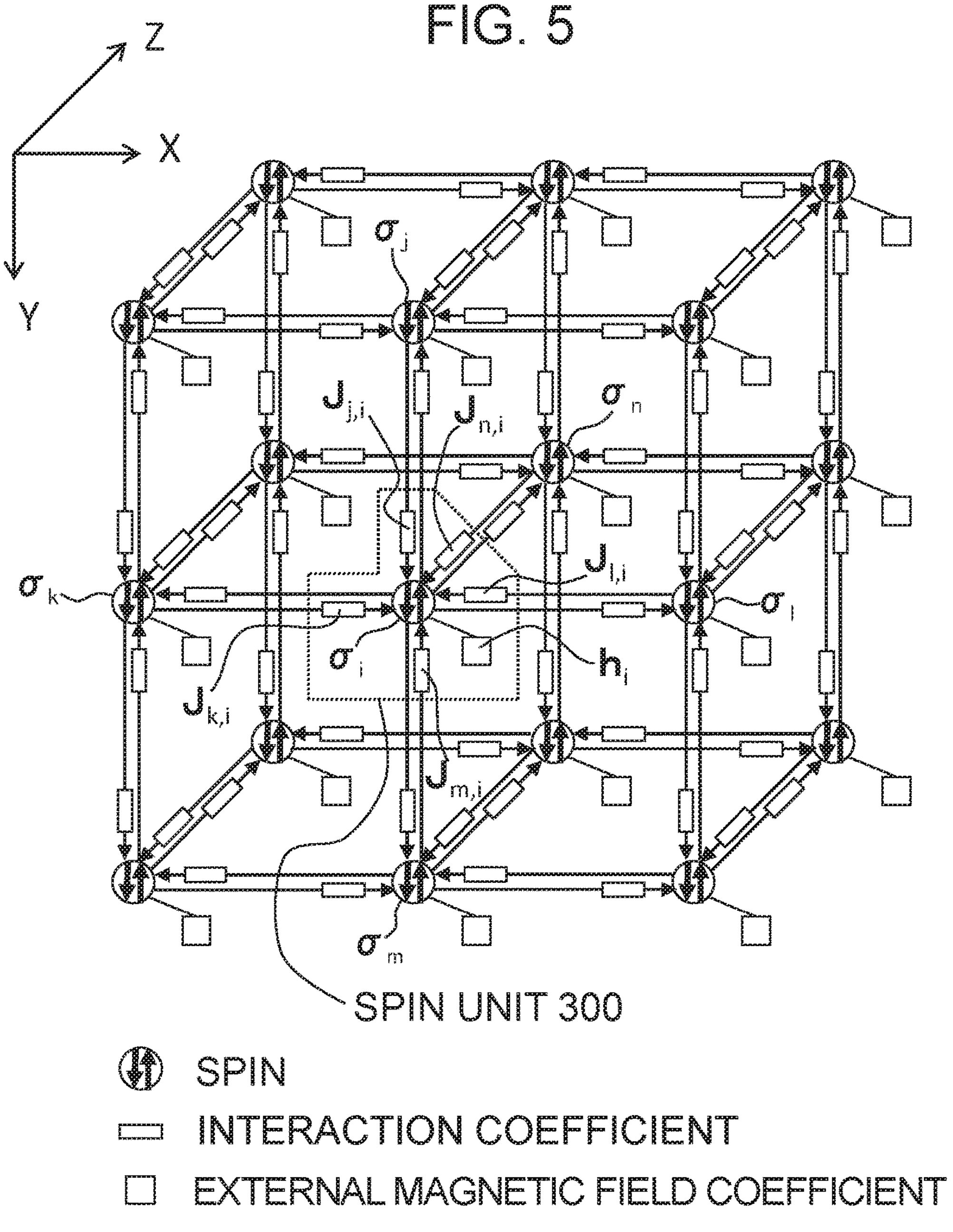
FIG. 5 is a view explaining an example of the configuration of a spin array in a three-dimensional lattice.

The spin array 110 is made up of a large number of spin units 300 arrayed as basic component units, each of which holds one spin and an interaction coefficient and an external magnetic field coefficient accompanying the spin and implements ground state search processing. FIG. 5 shows an example in which an Ising model with a three-dimensional lattice topology is formed by arraying a plurality of spin units 300. The example of FIG. 5 is a three-dimensional lattice with a size of 3 (X-axis direction)×3 (Y-axis direction)×2 (Z-axis direction). As for the definition of the coordinate axes, the right direction in the illustration is the X-axis, the downward direction in the illustration is the Y-axis, and the direction of depth in the illustration is the Z-axis, as illustrated. However, these coordinate axes are only necessary as a matter of convenience in the description of the example and therefore unrelated to the invention. In the case of using topologies other than a three-dimensional lattice, such as a tree-like topology, for example, the topology is expressed by the number of steps in the tree or the like, instead of coordinate axes. In the three-dimensional lattice topology of FIG. 5, if interactions between spins are seen as a graph, a maximum of spins (vertices) of the fifth degree are needed. Also, if the connection of the external magnetic field coefficients, the sixth degree is needed at the maximum.

In the one spin unit 300 shown in FIG. 5, the values of adjacent spins (for example, in the case where there are five adjacent spins) $\sigma_j$, $\sigma_k$, $\sigma_l$, $\sigma_m$, $\sigma_n$ are inputted. Also, the spin unit 300 has memory cells for holding interaction coefficients $J_{j,i}$, $J_{k,i}$, $J_{l,i}$, $J_{m,i}$, $J_{n,i}$ with the adjacent spins (interaction coefficients with the five adjacent spins), in addition to a spin $\sigma_i$ and an external magnetic field coefficient $h_i$.

Incidentally, an Ising model generally has interactions expressed by an undirected graph. The above-described Math. 1 has $J_{i,j}\times\sigma_i\times\sigma_j$ as a term expressing an interaction. This expresses the interaction from the i-th spin to the j-th spin. In this case, in a typical Ising model, the interaction from the i-th spin to the j-th spin and the interaction from the j-th spin to the i-th spin are not discriminated from each other. That is, $J_{i,j}$ and $J_{j,i}$ are the same. However, in the Ising chip 100 of the invention, this Ising model is extended to a directed graph, realizing that the interaction from the i-th spin to the j-th spin and the interaction from the j-th spin to the i-th spin are asymmetrical. Thus, the ability of expression of the model is enhanced, enabling many problems to be expressed by a smaller-scale model.

Therefore, when one spin unit 300 is considered to have the i-th spin $\sigma_i$, the interaction coefficients $J_{j,i}$, $J_{k,i}$, $J_{l,i}$, $J_{m,i}$, $J_{n,i}$ held by this spin unit decide the interactions from the adjacent j-th, k-th, l-th, m-th, n-th spins $\sigma_j$, $\sigma_k$, $\sigma_l$, $\sigma_m$, $\sigma_n$ to the i-th spin $\sigma_i$. This corresponds to the directions of the arrows (interactions) to which the interaction coefficients included in the spin unit 300 correspond, heading from spins outside the illustrated spin unit 300 toward the spin inside the spin unit 300 in FIG. 5.

(6) Configuration of Spin Unit

Figure 3:
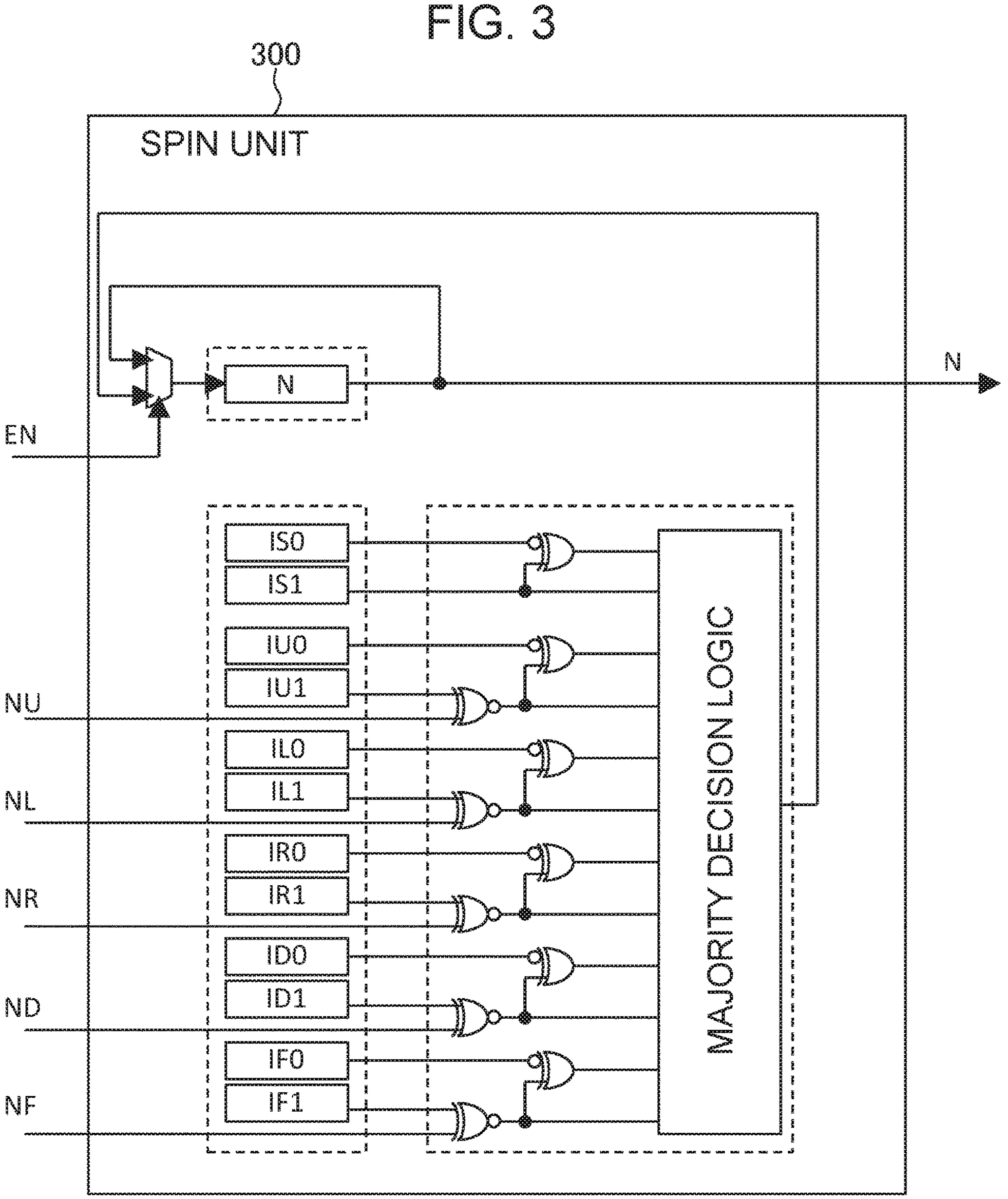
FIG. 3 is a view explaining an example of the configuration of a spin unit in terms of the configuration of a circuit which performs interactions between spin units.
Figure 4:
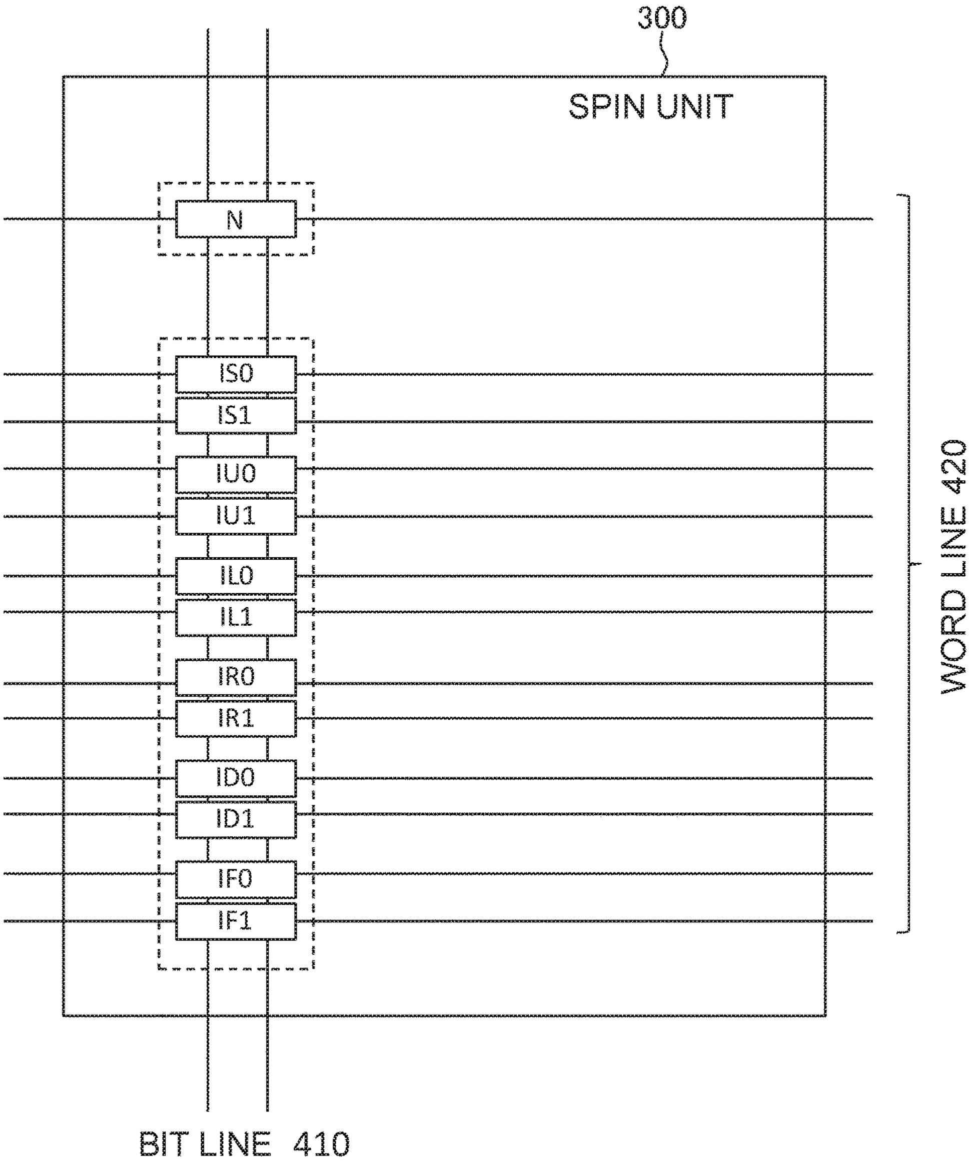
FIG. 4 is a view explaining an example of the configuration of a spin unit in terms of the configuration for accessing memory cells provided in the spin unit.

An example of the configuration of the spin unit 300 will be described using FIGS. 3 and 4. The spin unit 300 has two aspects, which are described separately with reference to FIGS. 3 and 4 as a matter of convenience. However, both of the configurations shown in FIGS. 3 and 4 are included in the one spin unit 300. FIG. 3 shows a circuit for implementing interactions between spin units. FIG. 4 shows an illustration focusing on word lines and bit lines, which are interfaces for accessing the memory cells provided in the spin unit, from outside the Ising chip 100. How the interfaces EN, NU, NL, NR, ND, NF, N illustrated in the circuit for implementing interactions in FIG. 3 are wired between a plurality of spin units will be described later with reference to FIGS. 10 and 25. Also, how the word lines and the bit lines in FIG. 4 are wired between a plurality of spin units will be described later with reference to FIG. 9.

The spin unit 300 has a plurality of 1-bit memory cells for holding the spin $\sigma_i$, the interaction coefficients $J_{j,i}$, . . . $J_{n,i}$, and the external magnetic field coefficient $h_i$. The 1-bit memory cells are shown as N, IS0, IS1, IU0, IU1, IL0, IL1, IR0, IR1, ID0, ID1, IF0, IF1 in the illustration. Since IS0 and IS1, IU0 and IU1, IL0 and IL1, IR0 and IR1, ID0 and ID1, and IF0 and IF1 play their roles in a combination of two each, the respective combinations are simply referred to as ISx, IUx, ILx, IRx, IDx, and IFx.

Figure 19:
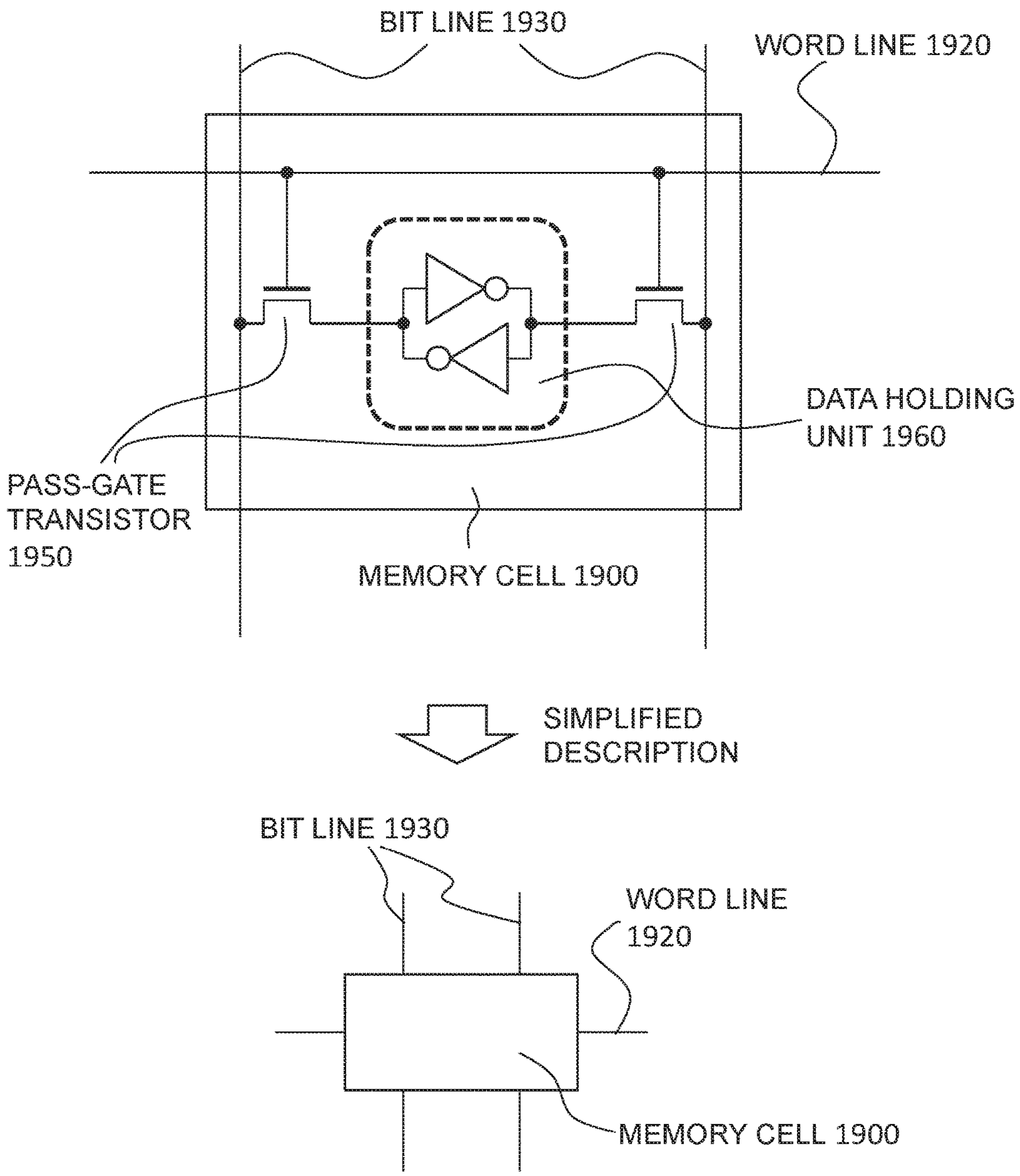
FIG. 19 is a view explaining an example of the configuration of a memory cell.

An example of the structure of each memory cell provided in the spin unit 300 is shown as a memory cell 1900 in FIG. 19. The memory cell 1900 has a data holding unit 1960 made up of two CMOS inverters, and controls pass-gate transistors 1950 with a work line 1920 and bit lines 1930, thus realizing data reading from and data writing to the data holding unit 1960.

Here, the description is given on the assumption that the spin unit 300 expresses the i-th spin. The memory cell N is a memory cell for expressing the spin $\sigma_i$ and holds the value of the spin. The value of the spin, which is +1 and −1 (+1 is also expressed as up, and −1 is also expressed as down) in the Ising model, is made to correspond to the binary values of 0 and 1 in the memory cell. For example, +1 corresponds to 1, and −1 corresponds to 0.

Figure 28:
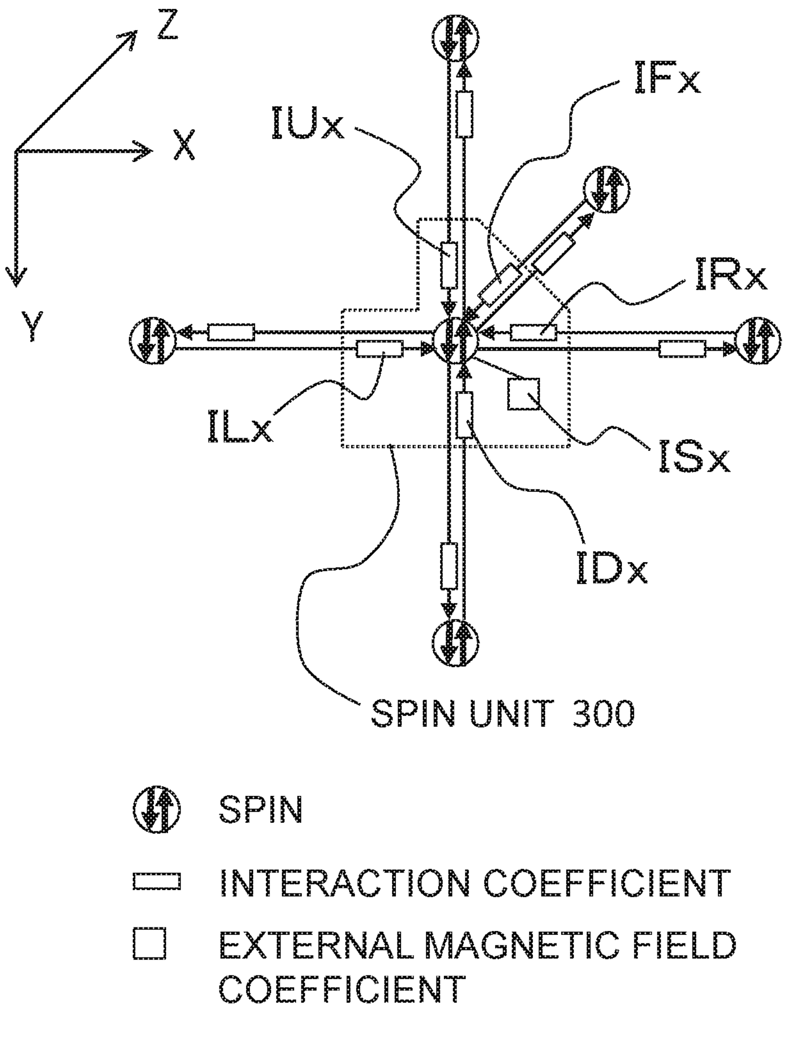
FIG. 28 is a view explaining the correspondence between memory cells in a spin unit and the topology of a spin array.

Using FIG. 28, the correspondence between the memory cells provided in the spin unit 300 and the topology of the Ising model shown in FIG. 5 is shown. ISx expresses the external magnetic field coefficient. IUx, ILx, IRx, IDx, IFx each express the interaction coefficients. IUx expresses the interaction coefficient with the spin on the upper side (−1 in the Y-axis direction). ILx expresses the interaction coefficient with the spin on the left side (−1 in the X-axis direction). IRx expresses the interaction coefficient with the spin on the right side (+1 in the X-axis direction). IDx expresses the interaction coefficient with the spin on the lower side (+1 in the Y-axis direction). IFx expresses the interaction coefficient with the spin connected in the direction of depth (+1 or −1 in the Z-axis direction). Also, in the case where the Ising model is seen as a directed graph, when viewed from one spin, the coefficients of the influence of the other spins on the one spin are provided. The coefficients of the influence of the one spin on the other spins belong to the other spins, respectively. That is, this spin unit 300 is connected to a maximum of five spins. In the Ising chip 100 in this example, the external magnetic field coefficient and the interaction coefficients correspond to the ternary values of +1, 0, −1. Therefore, in order to express the external magnetic field coefficient and the interaction coefficients, a 2-bit memory cell is needed for each. For ISx, IUx, ILx, IRx, IDx, IFx, the ternary values of +1, 0, −1 are expressed by a combination of two memory cells with numbers at the end being 0 and 1 (in the case of ISx, for example, IS0 and IS1). In the case of ISx, for example, IS1 expresses +1 and −1. When IS1 is 1, it expresses +1. When IS1 is 0, it expresses −1. In addition, when IS0 is 0, the external magnetic field coefficient is regarded as 0. When IS0 is 1, one of +1 and −1 decided by the IS1 is used as the external magnetic field coefficient. If the external magnetic field coefficient is considered to be disabled when the external magnetic field coefficient is 0, it can be said that IS0 is an enable bit of the external magnetic field coefficient (when IS0=1 holds, the external magnetic field coefficient is enabled). IUx, ILx, IRx, IDx, IFx expressing the interaction coefficients similarly have the correspondence between their respective coefficients and bit values.

Figure 20:
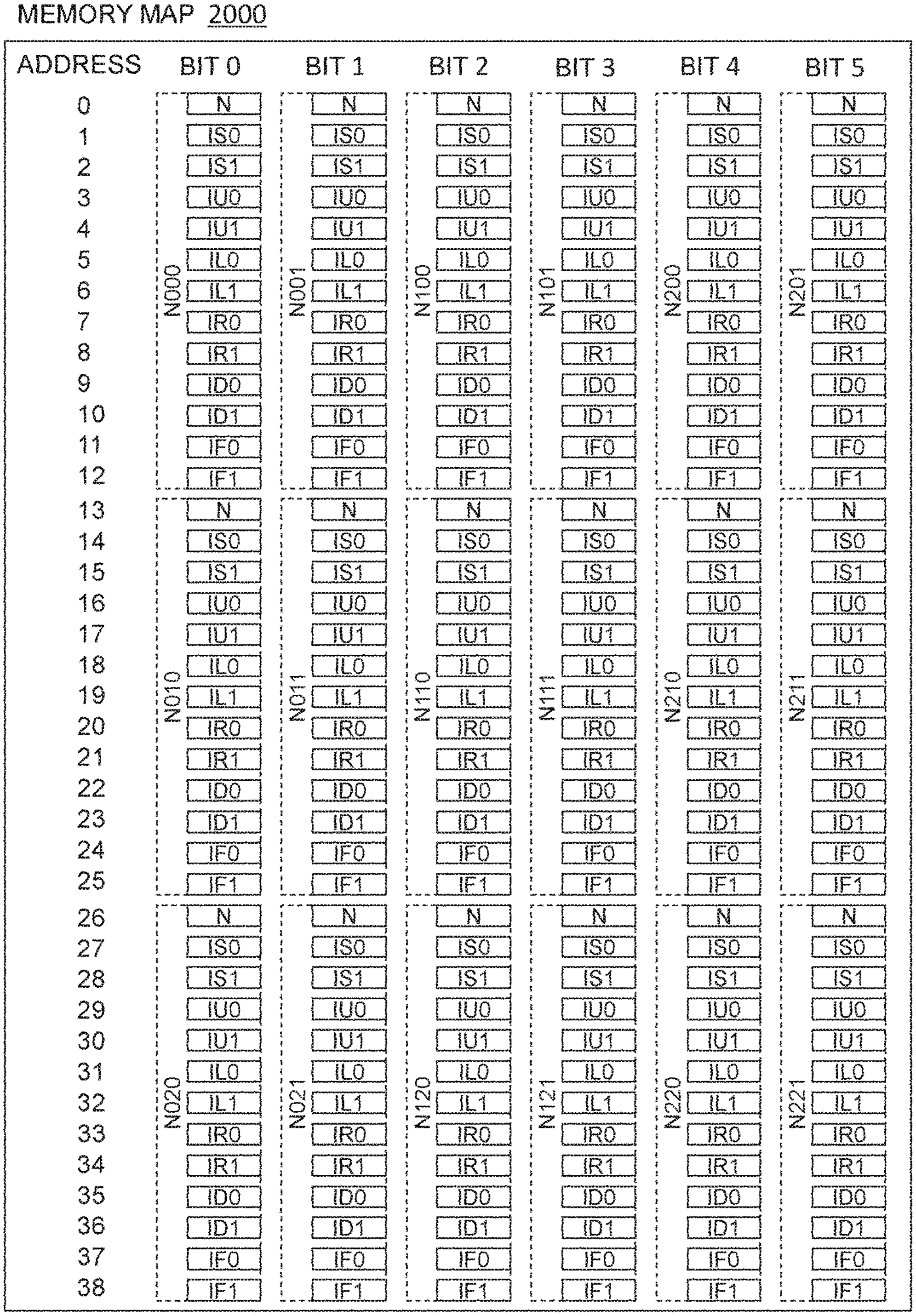
FIG. 20 is a view explaining an example of a memory map of an Ising chip.

Each of the memory cells N, IS0, IS1, IU0, IU1, IL0, IL1, IR0, IR1, ID0, ID1, IF0, IF1 in the spin unit 300 must readable/writable from outside the Ising chip 100. To this end, the spin unit 300 has bit lines 410 and word lines 420, as shown in FIG. 4. If the spin units 300 are arrayed like tiles on a semiconductor substrate, with the bit lines 410 and the word lines 420 connected, and are driven, controlled and read via the I/O address decoder 130 and the I/O driver 120, reading from and writing to the memory cells in the spin units 300 can be performed via the SRAM-compatible interface 150 of the Ising chip 100, similarly to a common SRAM (Static Random Access Memory). Thus, a memory map of the Ising chip 100 can be drawn. The memory map of the Ising chip 100 of the 3×3×2 three-dimensional Ising model shown in FIG. 5 is shown as a memory map 2000 in FIG. 20. Signs such as N000 and N001 indicate the coordinates of spin units, with N followed by the coordinate in the X-axis direction, the coordinate in the Y-axis direction, and the coordinate in the Z-axis direction. For example, the spin unit illustrated as the spin unit 300 in FIG. 5 (spin unit in the middle at the front of the three-dimensional lattice) is expressed as N110.

(7) Arrangement of Spin Units in Spin Array

Figure 8:
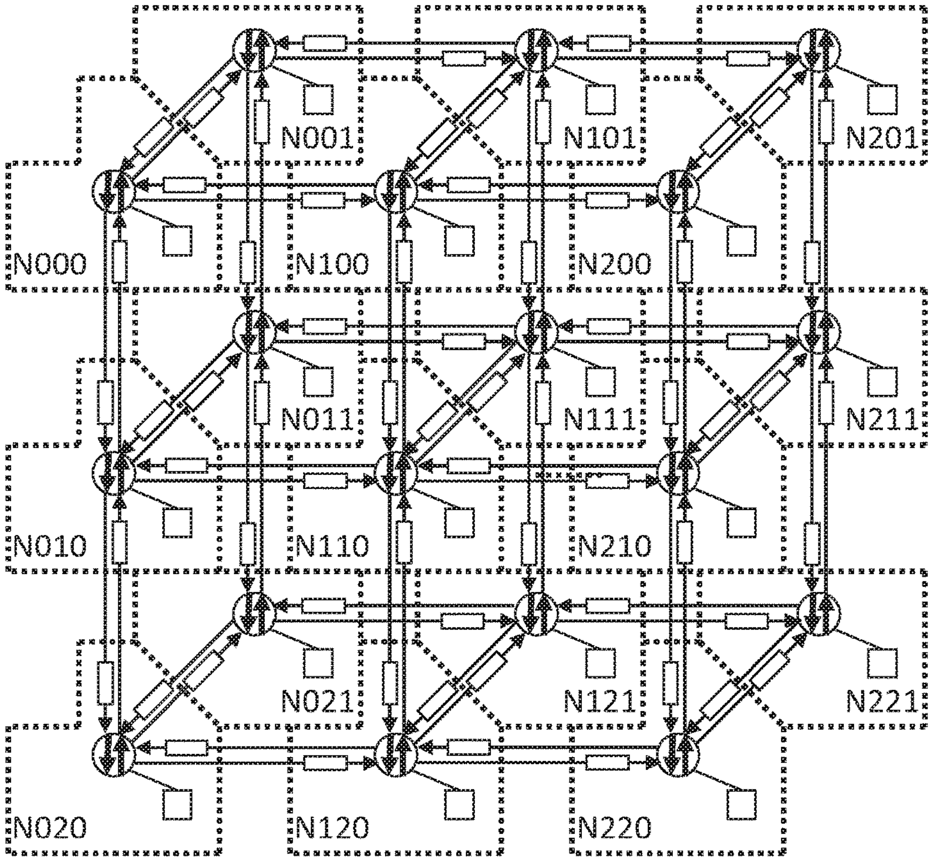
FIG. 8 is a view explaining an example of correspondence between a spin array in a three-dimensional lattice and spin units.
Figure 9:
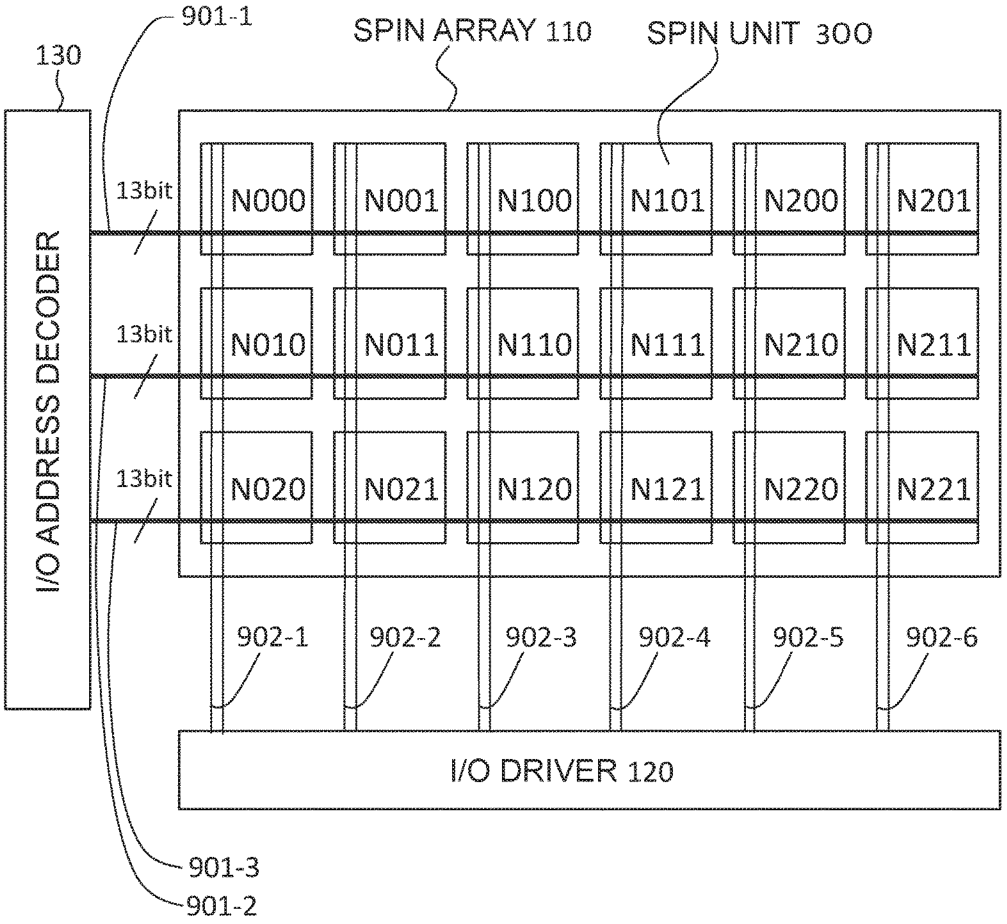
FIG. 9 is a view explaining an example of the arrangement of spin units on an Ising chip.

The configuration of the spin array 110 will be described with reference to FIG. 9, in terms of the layout as a semiconductor device. Since the spin array 110 in this example has a three-dimensional lattice topology as shown in FIG. 5, the layout needs to be devised in order to implement the spin array as a semiconductor device with a circuit formed on a two-dimensional plane. Thus, an arrangement as shown in FIG. 9 is employed. Which vertices in the three-dimensional lattice topology the spin units 300 expressed in FIG. 9 (each given a sign according to its position on the X-axis, Y-axis and Z-axis, such as Nxyz) correspond, is shown in FIG. 8. In order to arrange the vertices of the 3×3×2 three-dimensional lattice on a two-dimensional plane, each lattice vertex in the lattice vertex arrangement in the Z-axis direction is inserted between vertices in the lattice vertex arrangement in the X-axis direction. That is, in the Y-axis direction on the two-dimensional plane of FIG. 9 (the lower side in the illustration is the positive Y-axis direction), Nx0z, Nx1z, Nx2z and the like are arranged, whereas in the X-axis direction (the right side in the illustration is the positive X-axis direction), spin units with the coordinates in the Z-axis direction of 0 and 1 are alternately arranged, such as N0y0, N0y1, N1y0, N1y1, N2y0, N2y1.

On the Ising chip 100, physically, the spin units 300 are arranged as shown in FIG. 9, and word lines 901-1, 901-2, 901-3 and bit lines 902-1, 902-2, 902-3, 902-4, 902-5, 902-6 as shown in FIG. 9 are wired thereon. These word lines and bits lines are connected to the word lines 420 and the bit lines 410 of the spin unit 300 shown in FIG. 4. Since each spin unit has 13 memory cells in the direction of arrangement of the word lines (the word lines 420 have 13 bits), each of the word lines 901-1, 901-2, 901-3 has 13 bits.

(8) Control of Ground State Search Processing of Ising Model

To implement ground state search of an Ising model, interactions between spins must be realized in such a way as to make a transition to achieve a spin arrangement in which the energy of the entire Ising model is lower. The interactions to this end are carried out on the basis of the interaction coefficients and the external magnetic field coefficients that are provided. That is, the next value of one spin is decided on the basis of the interactions from the other spins connected to that spin and the external magnetic field coefficient held by that spin. At this time, the next value of the spin is a value that minimizes local energy within the range in which the spin is connected.

As this update of the spin, it is conceivable that the individual spins are sequentially updated one by one. However, this method takes time proportionate to the number of spins and therefore parallelism cannot be utilized. Thus, it is desirable that interactions between spins are carried out simultaneously in parallel with respect to all of the spins.

However, in the case of updating all of the spins simultaneously, the values of adjacent spins are viewed at the time of updating one spin and the spin is updated in such a way as to minimize the energy with the adjacent spins, and therefore if the values of the adjacent spins are updated simultaneously with this, both updates overlap with each other and the energy cannot be minimized, resulting in vibration. That is, when updating one spin, spins connected to that spin (spins directly connected to one spin via interaction coefficients are called adjacent spins hereinafter) cannot be updated simultaneously.

Thus, according to the invention, in order not to update the adjacent spins simultaneously, the spin units 300 in the spin array 110 are grouped and only one group is updated simultaneously at a time. In the case of the topology as shown in FIG. 5, the spin units can be divided into two groups. Then, these two groups are updated alternately. In order to designate the group to be updated at a certain timing, the Ising chip 100 has the interaction address 180 as an input interface. The interaction address 180 is an interface for designating the group to be updated, of the above groups, and with the input of the interaction clock 181, the spins (spin units 300) belonging to the group designated by the interaction address 180 are updated simultaneously.

This method requires no additional hardware in the spin unit 300 and only needs to provide a set of interaction address decoders 140 for the entire Ising chip 100. Therefore, the foregoing problem can be solved without complicating the spin units 300 as component units.

Figure 25:
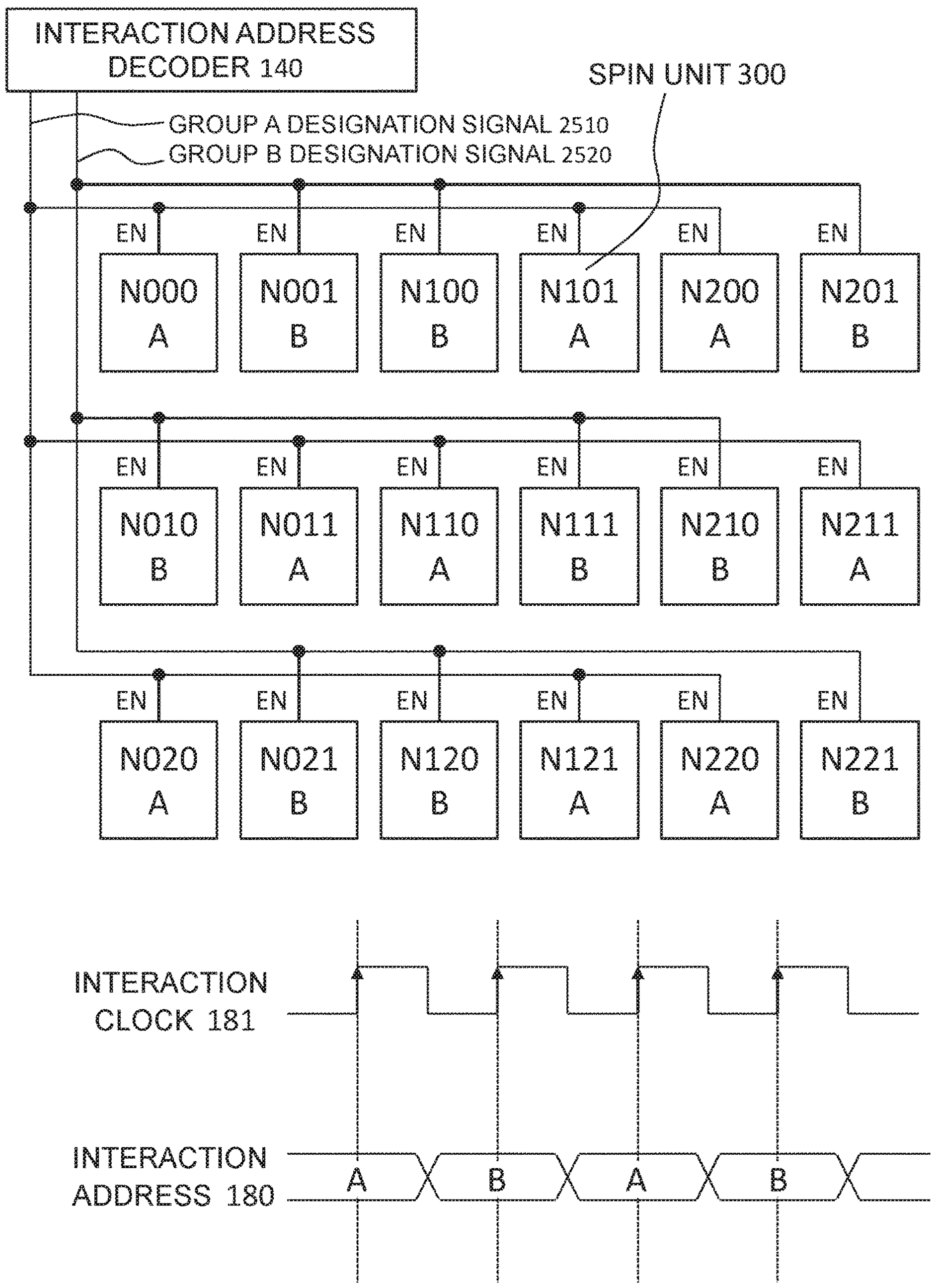
FIG. 25 is a view explaining the relation between the grouping of spin units, interaction clock, and interaction address.
Figure 26:
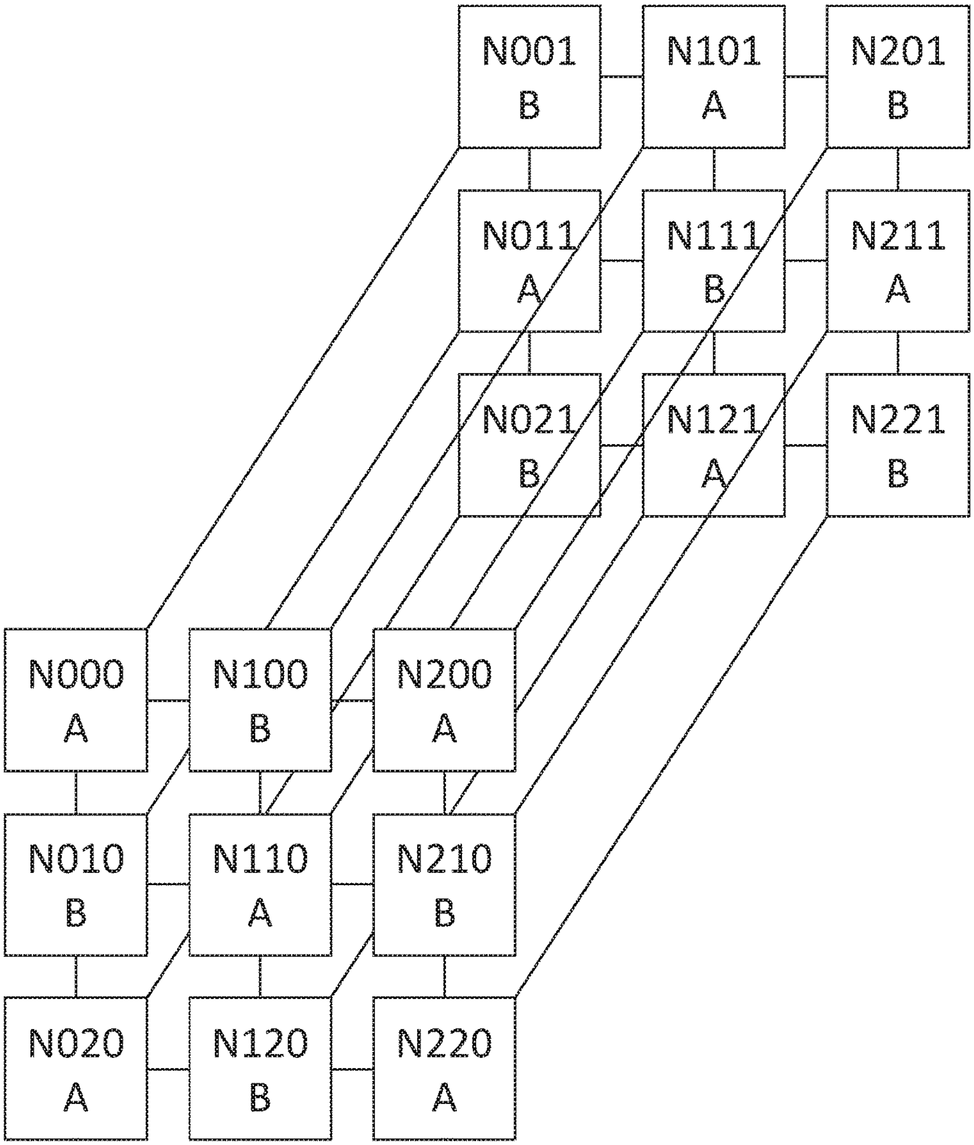
FIG. 26 is a view explaining the grouping of spin units, corresponding to a spin array in a three-dimensional lattice.

The grouping will be described using FIG. 25. In FIG. 25, the spin units Nxyz are grouped into two groups, that is, group A and group B. Each spin unit 300 has an interface (EN) for inputting a signal which enables the update of the spin, as described later. Thus, the address (group identifier) designated by the interaction address 180 is decoded by the interaction address decoder 140, and an update enable signal for each group is generated. In the example of FIG. 25, a group A designation signal 2510 and a group B designation signal 2520 are update enable signals for each group. Then, with the interaction clock 181, the spin units belonging to the group that is enabled to be updated at the time are updated. It can be easily understood from FIG. 26 that, by the grouping shown in FIG. 25, adjacent spins in the topology of FIG. 5 are always in different groups.

Also, the grouping of the spin unit 300 may be further subdivided as a matter of convenience in power consumption in addition to the above collision avoidance of simultaneous updates. For example, in the above example, the collision of updates can be avoided by dividing into two groups. However, if power consumption poses a problem when all of the spins are to be updated simultaneously, one group may be further subdivided, for example. For example, in the grouping into two groups, one group is divided into four, resulting in eight groups in total, as a matter of convenience in power consumption.

(9) Circuit Configuration for Deciding Next State of Spin Provided in Spin Unit

Each of the spin units 300 independently has a circuit for calculating the interaction and deciding the next state of the spin, in order to perform simultaneous update. The circuit for deciding the next state of the spin is shown in FIG. 3. In FIG. 3, the spin unit has EN, NU, NL, NR, ND, NF, N as interfaces to the outside. EN is an interface for inputting a signal which enables the update of the spin of the spin unit in question. N is an interface for outputting the value of the spin of the spin unit in question to the other spin units (adjacent units in the topology of FIG. 5). NU, NL, NR, ND, NF are interfaces for respectively inputting the values of the spins held by the other spin units (adjacent units in the topology of FIG. 5). NU is for the input from the spin on the upper side (−1 in the Y-axis direction). NL is for the input from the spin on the left side (−1 in the X-axis direction). NR is for the input from the spin on the right side (+1 in the X-axis direction). ND is for the input from the spin on the lower side (+1 in the Y-axis direction). NF is for the input from the spin connected in the direction of depth (+1 or −1 in the Z-axis direction). In considering the topology of the Ising model, processing at the edges needs to be decided. If the edges are simply cut off as in the topology of FIG. 5, no input needs to be made to those corresponding to the edges, of NU, NL, NR, ND, NF (in terms of the circuit, proper processing is performed as unused input terminals, such as connecting to a fixed value of 0 or 1). For example, in the case of the spin unit of N000, the two terminals NU and NL have no input.

In the spin unit 300, the next state of the spin is decided in such a way as to minimize the energy with the adjacent spins. This is equivalent to determining which of the positive value and the negative value is dominant, when looking at the product of each adjacent spin and the interaction coefficient with it and the external magnetic field coefficient. For example, on the assumption that the i-th spin $\sigma_i$ is adjacent to the spins $\sigma_j$, $\sigma_k$, $\sigma_l$, $\sigma_m$, $\sigma_n$, the next state of the spin $\sigma_i$ is decided as follows. First, it is assumed that the values of the adjacent spins are $\sigma_j=+1$, $\sigma_k=-1$, $\sigma_l=+1$, $\sigma_m=-1$, $\sigma_n=+1$, that the interaction coefficients are $J_{j,i}=+1$, $J_{k,i}=+1$, $J_{l,i}=+1$, $J_{m,i}=-1$, $J_{n,i}=-1$, and that the external magnetic field coefficient is $h_i=+1$. In this case, the products of the interaction coefficients and the adjacent spins, and the external magnetic field coefficient, are laid out as follows: a $\sigma_j \times J_{j,i}=+1$, $\sigma_k \times J_{k,i}=-1$, $\sigma_l \times J_{l,i}=+1$, $\sigma_m \times J_{m,i}=+1$, $\sigma_n \times J_{n,i}=-1$, $h_i=+1$. The external magnetic field coefficient can be regarded as an interaction coefficient with a spin whose value is constantly +1.

Here, the local energy between the i-th spin and the adjacent spins is expressed by the above respective coefficients multiplied by the value of the i-th spin and then having their signs reversed. For example, the local energy with the j-th spin is −1 when the i-th spin is +1, and +1 when the i-th spin is −1. Therefore, having the i-th spin of +1 serves to reduce the local energy here. When such local energy is considered with respect to all the adjacent spins and the external magnetic field coefficient, which of +1 and −1 should be taken by the i-th spin in order to reduce the energy is calculated. For this, which of +1 and −1 is in a larger number, in the products of the interaction coefficients and the adjacent spins and the external magnetic field coefficient laid out above, may be counted. In the above example, there are four +1s and two −1s. The sum of the energy is −2 if the i-th spin is +1, whereas the sum of the energy is +2 if the i-th spin is −1. Therefore, the next state of the i-th spin that minimizes the energy can be decided by a majority decision in which when the number of +1s is greater, the next state of the i-th spin is decided as +1, whereas when the number of −1s is greater, the next state of the i-th spin is decided as −1.

The logic circuit shown in the spin unit 300 in FIG. 3 is a circuit for performing the above interactions. First, based on exclusive negative OR (XNOR) with the memory cells indicating +1/−1 of the states of the adjacent spins and the interaction coefficients, the next state of the spin that minimizes the energy when only looking at the interactions can be calculated (on the assumption that +1 is encoded as 1 and that −1 is encoded as 0). If the interaction coefficients consist only of +1 and −1, the next state of the spin can be decided by determining which of +1 and −1 is in a larger number in this output. As for the external magnetic field coefficient, if the external magnetic field coefficient is considered to be equivalent to an interaction coefficient with a spin whose state is constantly +1, the value of the external magnetic field coefficient is simply a value to be inputted to the majority decision logic for deciding the next state of the spin.

Next, a method for realizing the coefficient 0 will be considered. When there is majority decision logic $f(I_1, I_2, I_3, \ldots, I_n)$ with n inputs, the following proposition can be said to be true. First, it is assumed that there are duplicates $I'_1, I'_2, I'_3, \ldots, I'_n$ of the inputs $I_1, I_2, I_3, \ldots, I_n$ (for arbitrary k, $I_k=I'_k$). In this case, the output of $f(I_1, I_2, I_3, \ldots, I_n)$ is equal to that of $f(I_1, I_2, I_3, \ldots, I_n, I'_1, I'_2, I'_3, \ldots, I'_n)$ where the duplicates are inputted as well. That is, even if two inputs are entered for each input variable, the output is constant. Moreover, it is assumed that there is another input $I_x$ and its inverse $!I_x$ in addition to the $I_1, I_2, I_3, \ldots, I_n$. In this case, the output of f ($I_1, I_2, I_3, \ldots, I_n$, Ix, !IX) is equal to that of f ($I_1, I_2, I_3, \ldots, I_n$). That is, if an input variable and its inverse are inputted, it works to cancel the influence of the input variable in the majority decision. Utilizing this characteristic of the majority decision logic, the coefficient 0 is realized. Specifically, using XOR and the value of a bit (IS0 or the like) which decides the enable state of the coefficient, a duplicate of the value to be a candidate of the next state of the spin described above, or its inverse, is inputted at the same time to the majority decision logic, as shown in FIG. 3. For example, when IS0 is 0, since the value of IS1 and the inverse value of IS1 are simultaneously inputted to the majority decision logic, there is no influence of the external magnetic field coefficient (equivalent to where the external magnetic field coefficient is 0). Meanwhile, when IS0 is 1, the value of IS1 and the same value as this (duplicate) are simultaneously inputted to the majority decision logic.

(10) Measures to Avoid Local Optimum Solution in Ground State Search of Ising Model Although ground state search of the Ising model that is applied can be realized by minimizing the energy via the interactions between spins described above, this, when implemented alone, may fall into a local optimum solution. Since this technique basically works only toward reducing the energy, once it falls into a local optimum solution, it cannot escape from the local optimum solution and cannot reach a global optimum solution. Therefore, as an action to escape from the local optimum solution, the power-supply voltage supplied to the memory cell that expresses the spins is lowered, thus inducing a bit error in the memory cells and randomly changing the spin arrangement. Therefore, of the memory cells N, IS0, IS1, IU0, IU1, IL0, IL1, IR0, IR1, ID0, ID1, IF0, IF1 provided in the spin unit 300, the memory cells IS0, IS1, IU0, IU1, IL0, IL1, IR0, IR1, ID0, ID1, IF0, IF1 holding coefficients operate with the voltage supplied via the normal power supply line 142, whereas the memory cell N expressing the spin operates with the voltage supplied via the spin power supply line 141. All the component elements other than the memory cells, such as the logic gates for calculating interactions, for example, operate with the voltage supplied via the normal power supply line 142.

The bit error rate in the memory cells is proportionate to the voltage supplied to the memory cells. For example, with 1 V, the bit error rate is approximately $10^{-9}$. This bit error rate is suitable for the original purpose of the memories of holding storage contents. Therefore, generally, the memory cells are supplied with a voltage to this degree and used with a bit error rate suitable for holding storage contents. The foregoing memory cells IS0, IS1, IU0, IU1, IL0, IL1, IR0, IR1, ID0, ID1, IF0, IF1 are constantly used in this state. As the voltage is further lowered from this voltage, the bit error rate deteriorates in proportion to the extent of voltage drop. For example, if the voltage is lowered to approximately 0.6 V, the bit error rate becomes approximately $10^{-1}$, and the state where such a bit error can easily occur is used for an escape from the local optimum solution. Thus, with respect to the above memory cell N, in order not to fall in the local optimum solution by searching over a broader solution space in the initial stage of ground state search, for example, a low power-supply voltage such as 0.6 V is supplied to the spin power supply line 141, and ground state search based on interactions is performed in the circumstance where random bit errors occur. In this circumstance, basically, a transition is made to a state with lower energy by interactions. In parallel with this, the state randomly shifts due to bit errors. Thus, a transition to a state that cannot be achieved by interactions alone can occur, and a broader solution space can be searched. In order to stabilize the state with the ground state search progresses, the voltage is gradually changed to achieve a state where the bit error rate cannot easily occur. That is, initially, 0.6 V is supplied, which a voltage with which the bit error rate can easily occur, but the voltage is gradually brought closer to approximately 1 V, with which the bit error rate cannot easily occur. By utilizing such scheduling of the supplied voltage as well as the minimization of the energy based on interactions, ground state search that aims for a global optimum solution while escaping from a local optimum solution can be realized.

Also, instead of the generation of random bit errors based on the voltage supplied to the memory cells, random bit errors may be generated simulatively, using a random number generator circuit. In this case, a random number generator circuit may be provided in the spin unit 300, or a random number generator circuit may be provided in the Ising chip 100 so that random numbers are delivered to and used in each spin unit. Otherwise, a random number generator circuit may be provided outside the Ising chip 100 so that random numbers from outside the chip are delivered with the chip.

(11) Wiring Between Spin Units

Figure 10:
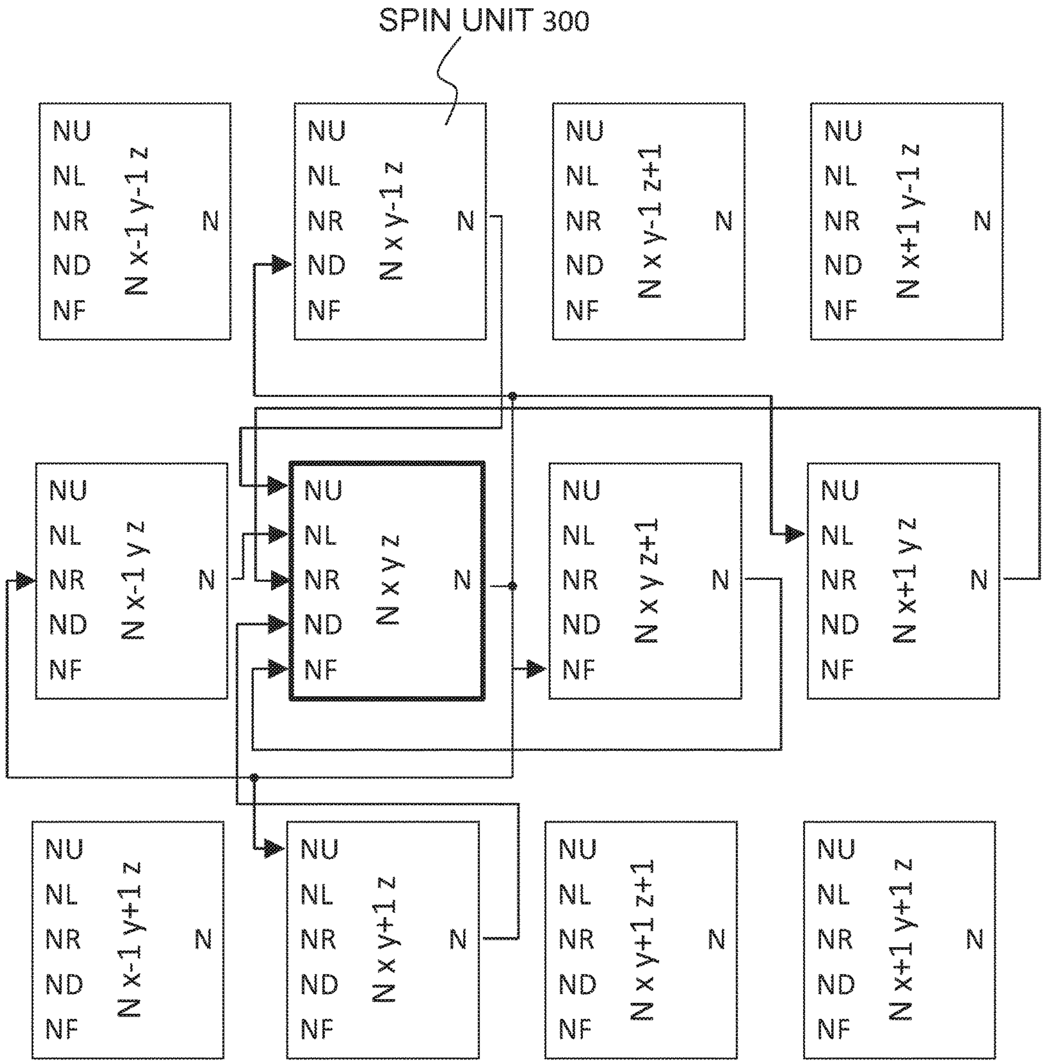
FIG. 10 is a view explaining an example of wiring to perform interactions between spin units.

With respect to EN, NU, NL, NR, ND, NF, N, which are the interfaces of the spin units shown in FIG. 3, the wiring of EN is as described above with reference to FIG. 25. An example of the wiring of NU, NL, NR, ND, NF, N is shown in FIG. 10. FIG. 10 shows the wiring necessary to realize the topology as shown in FIG. 5 with the spin units arranged as shown in FIG. 9, when focusing on one spin unit Nxyz. By providing such wiring for each spin unit, the topology of FIG. 5 can be realized.

(12) Control Procedure 1 for Ising Chip

Figure 6:
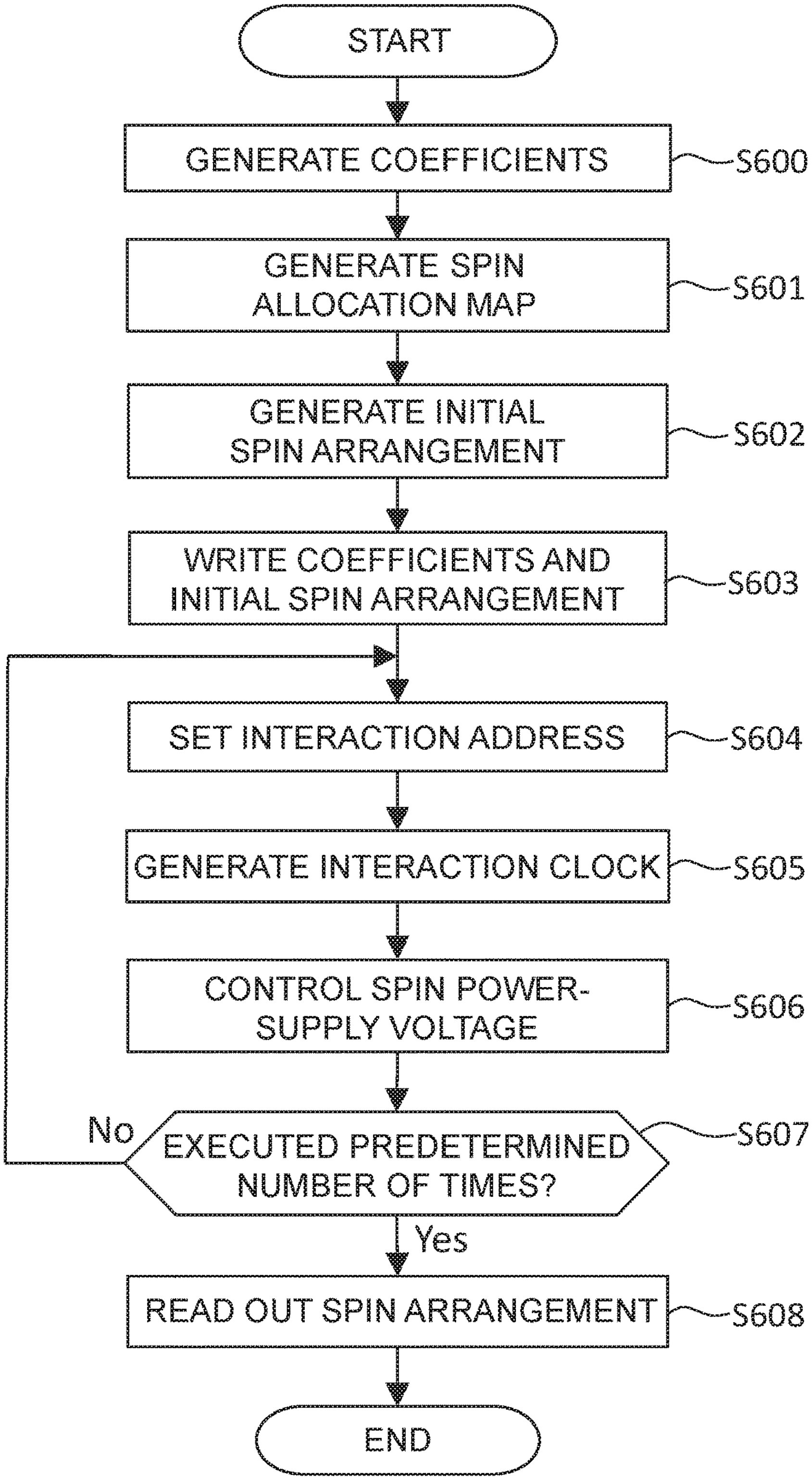
FIG. 6 is a flowchart explaining an example of Ising chip control procedures.

The procedure of performing ground state search in the information processing device 200 having this Ising chip 100 incorporated therein, with the CPU 210 controlling the Ising chip 100, is shown in FIG. 6.

In Step S600, interaction coefficients and external magnetic field coefficients of an Ising model which expresses a target problem are generated. In the case of an example of maximum cut problem, this refers to generating an Ising model as shown in FIG. 14 when a maximum cut problem as shown in FIG. 13 is given.

In Step S601, a spin allocation map is generated. The spin allocation map is information which defines how the Ising model is allocated to the Ising chip 100, when solving the Ising model to be solved with the Ising chip 100. As an example, an example of allocating the Ising model of FIG. 14 to the Ising chip 100 in this example will be described. The Ising model of FIG. 14 is a complete graph where each of the four spins is connected to all the others. This must be embedded into a three-dimensional lattice as shown in FIG. 5 held in the Ising chip 100.

Figure 16:
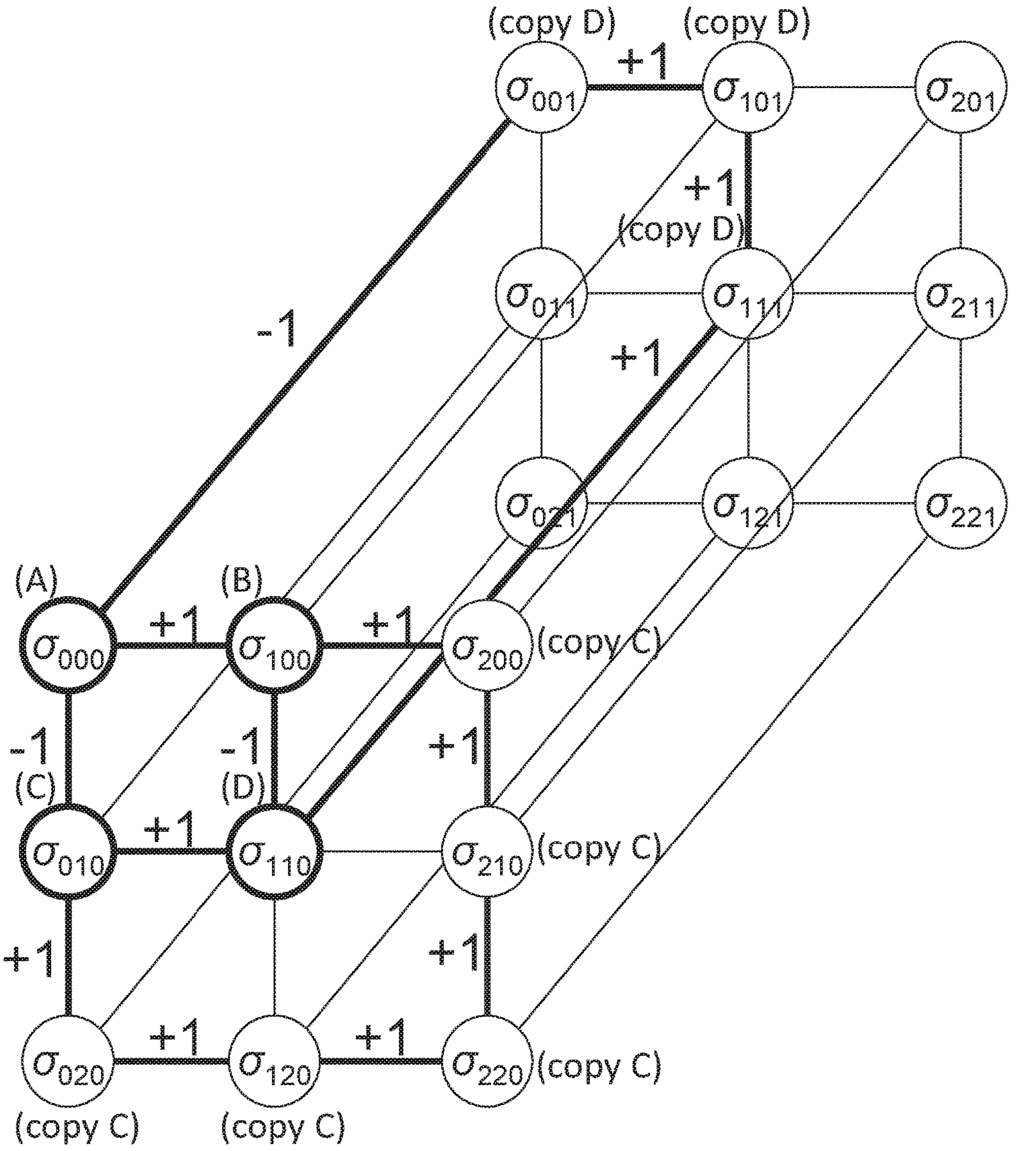
FIG. 16 is a view explaining an example of the allocation of an Ising model to an Ising chip.

FIG. 16 shows a spin allocation map to the Ising model of FIG. 14. In FIG. 16, the sides where the interaction coefficient is +1 or −1 are illustrated to that effect, and the sides with no value attached have an interaction coefficient of 0 (synonymous with not being connected). In FIG. 16, the spins A, B, C, D in the Ising model of FIG. 14 (hereinafter referred to as the original Ising model) are allocated to spins σ000, σ100, σ010, σ110, respectively. A spin σxyz corresponds to a spin unit expressed as Nxyz on the Ising chip 100. $J_{A,B}$ (interaction coefficient between the spins A and B), $J_{A,C}$ (interaction coefficient between the spins A and C), $J_{B,D}$ (interaction coefficient between the spins B and D), and $J_{C,D}$ (interaction coefficient between the spins C and D) in the original Ising model can be expressed, also on the Ising chip, using the X-Y plane where the coordinate in the Z-axis direction is 0 as shown in FIG. 16. However, $J_{A,D}$ (interaction coefficient between the spins A and D) and $J_{B,C}$ (interaction coefficient between the spins B and C), which are diagonal to each other in the lattice of the original Ising model, cannot be expressed on the above X-Y plane.

Thus, the concept of copy spin is introduced in the generation of the spin allocation map. A copy spin is a spin which is linked with and has the same value as the spin of the copy source. In an Ising model, positive interaction coefficients in an Ising model have the effect of equalizing spin values. Therefore, in the Ising chip 100, a copy spin can be realized simply by connecting to the spin of the copy source with the interaction coefficient 1. In FIG. 16, in order to realize $J_{A,D}$, a copy spin of the spin D (σ110) is prepared at σ001 adjacent to the spin A (σ000). To propagate the value of the spin D (σ110) to σ001, all of the interaction coefficients between σ110, σ111, σ101, and σ001 are set to be +1. Then, $J_{A,D}$ in the original Ising model (in the case of this example, −1) is set between σ000 and σ001. Similarly, in order to realize $J_{B,C}$, the spin C (σ010) is copied as σ020, σ120, σ220, σ210, and σ200, and $J_{B,C}$ (in the case of this example, +1) is set between σ200, which is a copy spin of the spin C, and the spin B (σ100).

Figure 17:
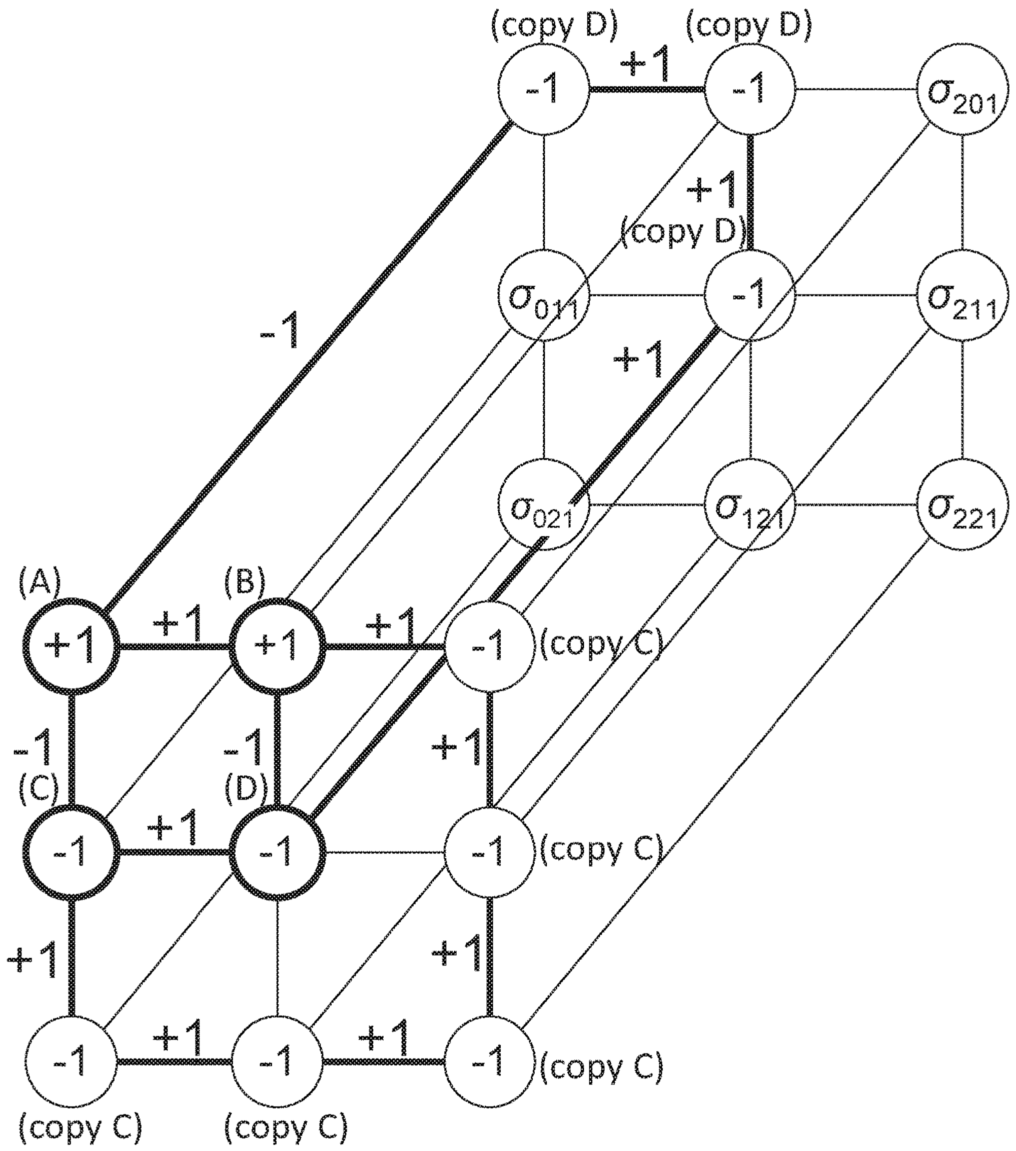
FIG. 17 is a view explaining an example of the allocation of an Ising model to an Ising chip.
Figure 18:
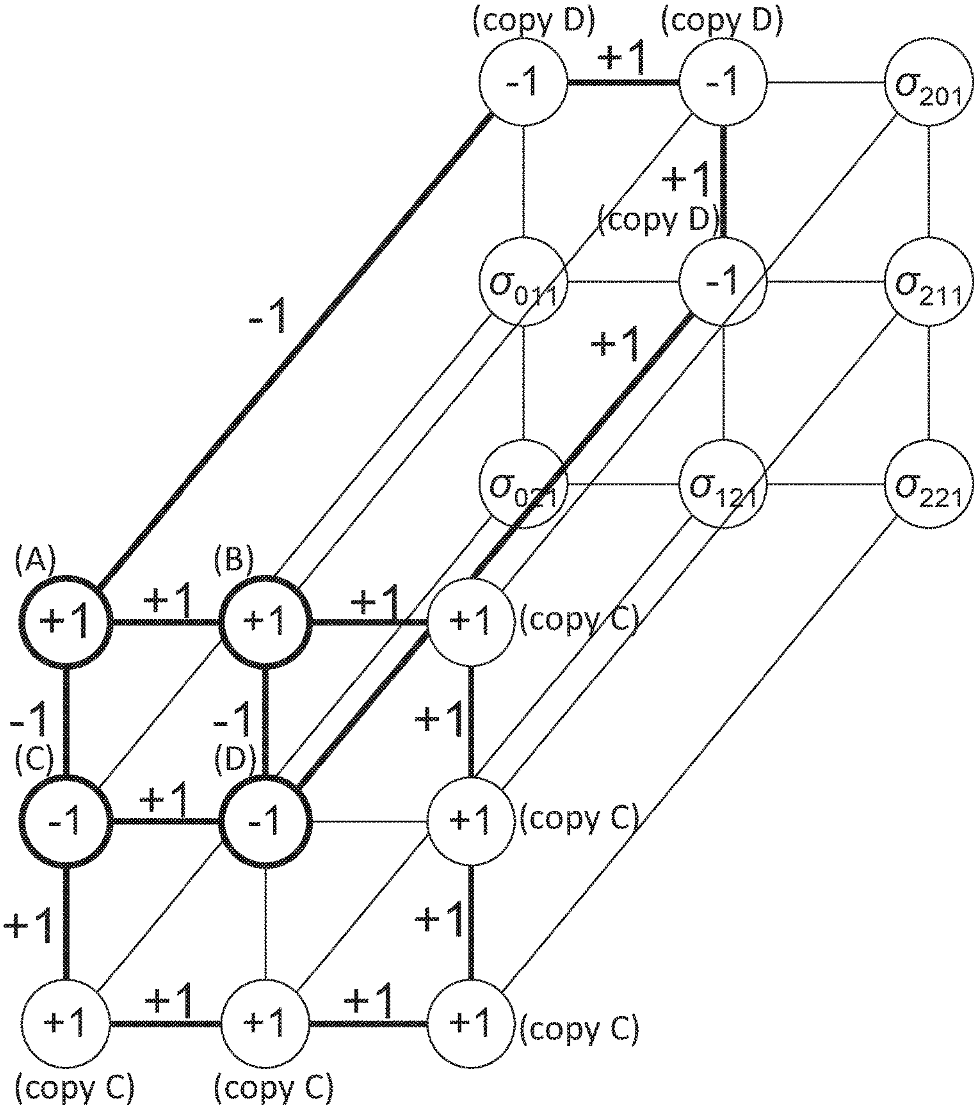
FIG. 18 is a view explaining an example of the allocation of an Ising model to an Ising chip.

Enabling the ground search state of the original Ising model by performing the ground state search of the Ising model in FIG. 16 will be described using FIGS. 17 and 18. A ground state of the original Ising model is as shown in FIG. 15. As described above, the state where all the spins in FIG. 15 are reversed is a ground state as well. FIGS. 17 and 18 show an example of the spin arrangement found as a ground state as a result of the ground state search of the Ising model in FIG. 16. Also, the state where all the spins in FIGS. 17 and 18 are reversed is a ground state as well and this corresponds to the ground state where FIG. 15 is reversed.

Looking at σ000, σ100, σ010, σ110 corresponding to the spins A, B, C, D in FIGS. 17 and 18, it can be confirmed that these spins have the same values as the spins A, B, C, D in FIG. 15 and that the same result as in FIG. 15 can be obtained by performing the ground state search of the Ising model in FIG. 16. However, the values of the copy spins introduced in FIG. 16 are slightly different between FIGS. 17 and 18. Specifically, σ020, σ120, σ220, σ210 and σ200, which are copy spins of the spin C, are all −1 in FIG. 17 and all +1 in FIG. 18. This is the state where, while the interaction coefficient between the spin B and the spin C is +1 and therefore the values of the spin B and the spin C should be the same if only the relation between these spins is considered, other interactions have greater influence and the interaction between the spin B and the spin C is, so to speak, surpassed. Since all the interaction coefficients between the copy spins are +1, all of σ020, σ120, σ220, σ210 and σ200 are to have the same value. Then, since the spin B and the spin C have their values decided by the influence of the other interactions, as described above, the energy of the entire model is unchanged whether the copy spins are +1 or −1. Therefore, there are two types of ground states, that is, the ground state where the copy spins of the spin C are +1 and the ground state where the copy spins are −1.

In Step S602, an initial spin arrangement, which is an initial value of the spin arrangement, is generated. In the generation of the initial spin arrangement, a spin arrangement is generated randomly with random numbers.

In Step S603, the coefficients obtained in Step S600 and the initial spin arrangement obtained in Step S602 are written in the memory cells of the Ising chip 100. At this time, the data writing into the Ising chip 100 is described as data 2100 in FIG. 21. The parts described as N/A in the data 2100 represent unused spins and therefore their values do no matter. The parts described as random represent the initial spin arrangement generated randomly in Step S602. The other parts where the value of 0 or 1 is entered are the coefficients obtained in Step S600. The initial setting is thus completed.

Subsequently, in Step S604, the interaction address 180 is inputted to the Ising chip 100. In Step S605, the interaction clock 181 is generated, thus causing interactions in the Ising chip 100. Also, in Step S606, the voltage supplied to the spin power supply line 141 is controlled, following the schedule. Such control is repeated a predetermined number of times (Step S607), and after the predetermined number of times is completed, the spin arrangement is read out from the Ising chip 100 to acquire an answer (Step S608).

(13) Control Procedure 2 for Ising Chip to Cope with Property Variations of Memory Cells Incidentally, as the Ising chip 100 is manufactured, property variations of the memory cells occur from one spin unit 300 in the spin array 110 to another, as described above. There are various causes of the variations. However, the individual difference of tending to become 0 or 1 occurs, when the powerful threshold voltage (Vth) of the transistors forming the memory cells varies, resulting in an unstable state where the power-supply voltage in the memory cells is lowered or the like. The variation factor may be a factor which is fixedly decided at the time of manufacturing, such as RDF (Random Dopant Fluctuation), or may be variation factor which dynamically changes in use, such as RTN (Random Telegraph Noise). In any case, memory cells with variations cause unbalanced randomness when trying to acquire randomness of the memory cells in order to escape from the local optimum solution. Consequently, the range of solution space that can be searched is narrowed.

Figure 7:
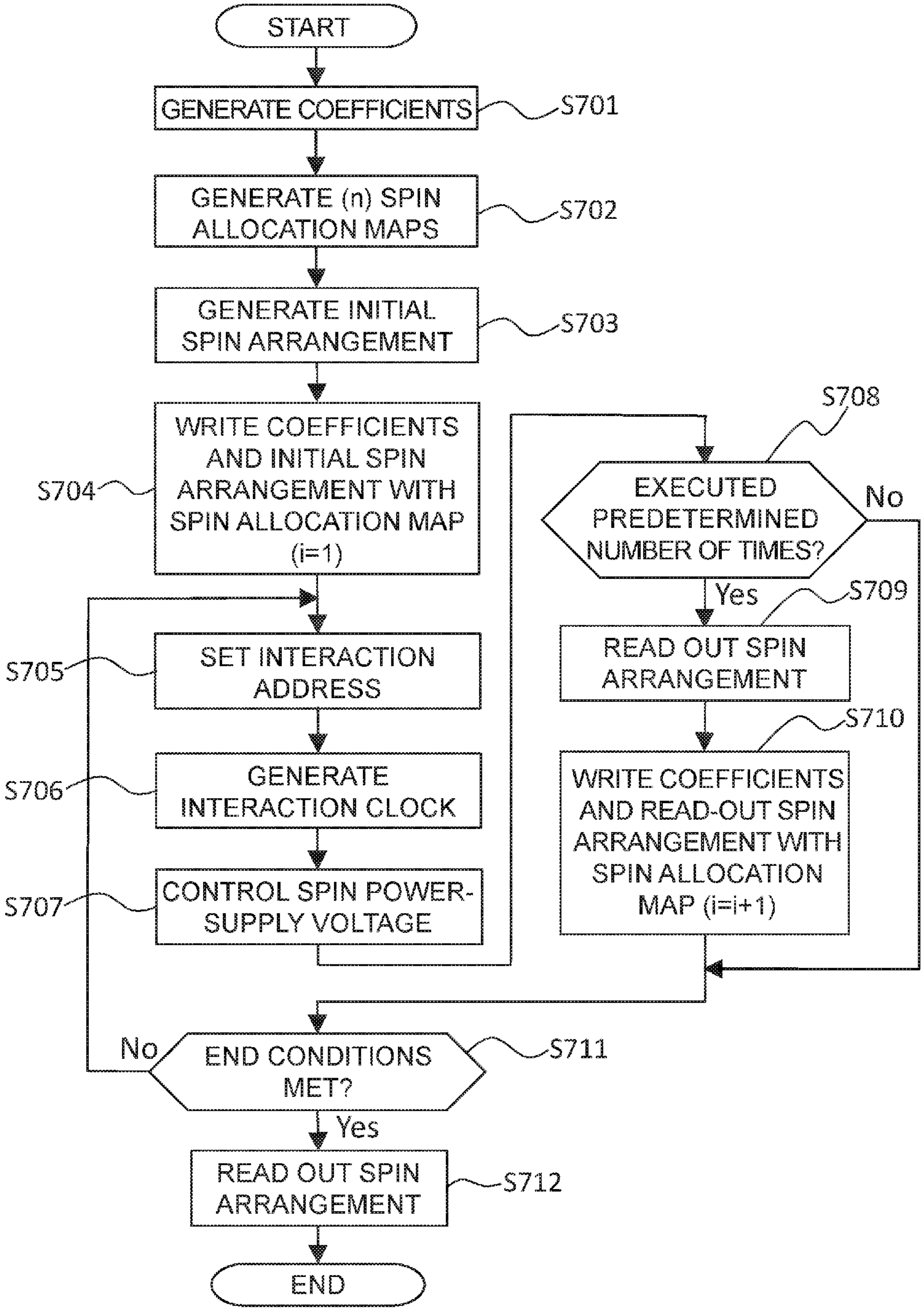
FIG. 7 is a flowchart explaining an example of Ising chip control procedures.

Thus, according to the invention, in order to adapt to the influence of variations of the memory cells, the Ising chip 100 is controlled through the procedure shown in FIG. 7. Step S701 is similar to Step S600. Next, in Step S702, a plurality of (n) spin allocation maps are generated. For example, the spin allocation map shown in FIG. 23 in addition to the spin allocation map shown in FIG. 16, that is, two spin allocation maps in total, are generated.

Figure 23:
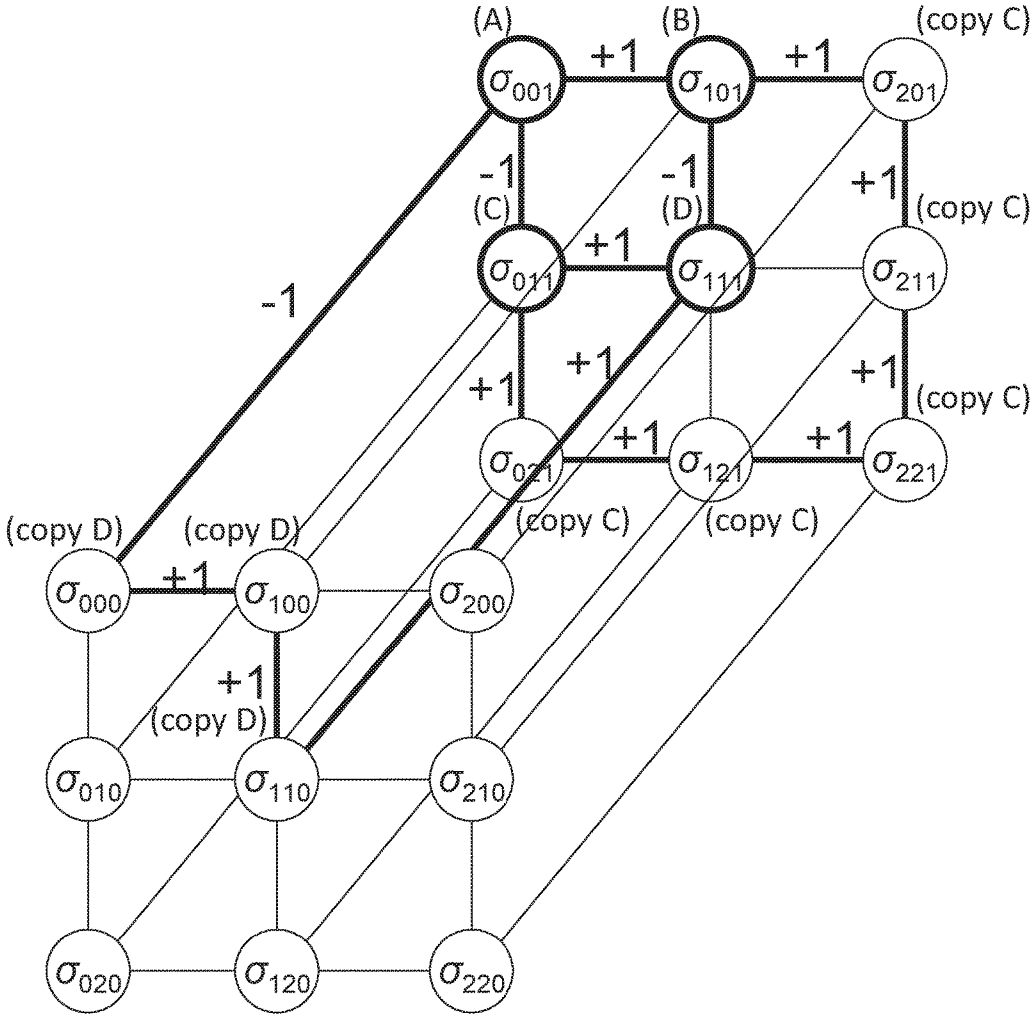
FIG. 23 is a view explaining an example of the allocation of an Ising model to an Ising chip.

The spin allocation map shown in FIG. 23 is an Ising model equivalent to the Ising model in FIG. 14 (original Ising model), as in FIG. 16. However, the allocation of spin units on the Ising chip corresponding to the spins A, B, C, D in the original Ising model is different from FIG. 16. In the example of FIG. 23, spins σ001, σ101, σ011 and σ111 are allocated to the spins A, B, C and D, respectively. In this way, it is the role of Step S702 to generate a plurality of spin allocation maps where the spins corresponding to the spins in the original Ising model are different. Also, as the allocation of the spins changes, the way interaction coefficients are provided between the spins and the positions of copy spins change accordingly.

On the assumption of the above, in Step S703, an initial spin arrangement is generated randomly with random numbers, as in Step S602. Then, in Step S704, according to one map of the plurality of spin allocation maps generated in Step S702, the coefficients and the initial spin arrangement are set to the Ising chip 100. For example, if the first map is FIG. 16, the data 2100 in FIG. 21 is written into the Ising chip 100.

Subsequently, in Steps S705 to S707, control of the interaction clock and the interaction address to perform interactions, and control of the spin power-supply voltage to randomly change the memory cells, are carried out, as in Steps S604 to S606. Here, after the control is executed a predetermined number of times (determined in Step S708), the spin arrangement is read out once from the Ising chip 100 in Step S709 and retracted into the RAM 220 of the information processing device 200 (the spin arrangement readout and placed on the RAM 220 is hereinafter called an intermediate spin arrangement).

An example of the data that can be readout from the Ising chip 100 at this point is shown as data 2200 in FIG. 22. Of the data 2200, the parts corresponding to the interaction coefficients and the external magnetic field coefficients are unchanged from the values written in the Ising chip 100 in Step S704 (data 2100). However, the values of the spins are changed as the result of the ground state search in Step S705 to S708. Of the data 2200, the parts described as N/A represent unused spins and therefore need not be read out. Also, tmp1, tmp2, tmp3, tmp4, tmp5, tmp6, tmp7 and tmp8 (hereinafter generically referred to as tmpX) are the parts used as copy spins and therefore need not be read out. In Step S709, it suffices to read out only the parts described as A, B, C and D of the data 2200, that is, the values of the spins to which the spins A, B, C and D in the original Ising model are allocated (the corresponding memory sites are surrounded by dotted-line circles).

After the intermediate spin arrangement is read out, the coefficients and the intermediate spin arrangement are written into the Ising chip 100 in Step S710, using a map that is different from the spin allocation map used up to this point. Thus, since the spin units 300 that are different from the previous ones are allocated to the spins, the influence of variations in the spin units 300 can be averaged. As this operation is repeated, the ground state search is executed, changing the correspondence between the spins and the spin units 300 at an intermediate point, and therefore the ground state search can be implemented adaptively to variations without causing the influence of variations in the spin units 300 to be accumulated at a specific spin (for example, causing the value of a specific spin to be +1 only).

The next spin allocation map to be used (i=i+1) is assumed to be FIG. 23, for example. Also, the intermediate values of the spins A, B, C and D have been read out in Step S709. Thus, data as shown in data 2400 in FIG. 24 is written into the Ising chip 100. The parts described as N/A represent unused spins and have arbitrary values. The interaction coefficients and the external magnetic field coefficients in the data 2400 are generated from the spin allocation map in FIG. 23. Then, the values of the spins A, B, C and D are applied, corresponding to the map of FIG. 23. That is, since σ001, σ101, σ011 and σ111 correspond to the spins A, B, C and D, respectively, in FIG. 23, the values of the spins A, B, C and D read out in Step S709 are written there (the corresponding memory sites are surrounded by dotted line circles). Then, since σ021, σ121, σ221, σ211 and σ201 are copy spins of the spin C, the value of the spin C is written there, and since σ110, σ100 and σ000 are copy spins of the spin D, the value of the spin D is written there. Thus, the result of the ground state search carried out to an intermediate point with the spin allocation map in FIG. 16 can be taken over and this time the ground state search can be carried out on the basis of the spin allocation map in FIG. 23.

Then, after it is determined in Step S711 that end conditions (the completion of execution by a predetermined number of times, and the completion of execution of the ground state search of the spins according to all the spin allocation maps created in Step S702) are met, the spin arrangement is read out in Step S712 and the processing end. When end conditions are not met, Steps S705 to S711 are repeated.

That is, according the invention, ground state search is performed, changing the correspondence between the spins in the Ising model of a target problem and the spin unit 300 on the Ising chip 100 at an intermediate point during the ground state search. To change the correspondence between the spins and the spin unit, the intermediate spin arrangement must be temporarily saved and rewritten along with the coefficients into another spin unit 300. This is realized by the operation of FIG. 7 described above, thus realizing the Ising chip 100 adapted to process variations in the spin units 300.

Figure 27:
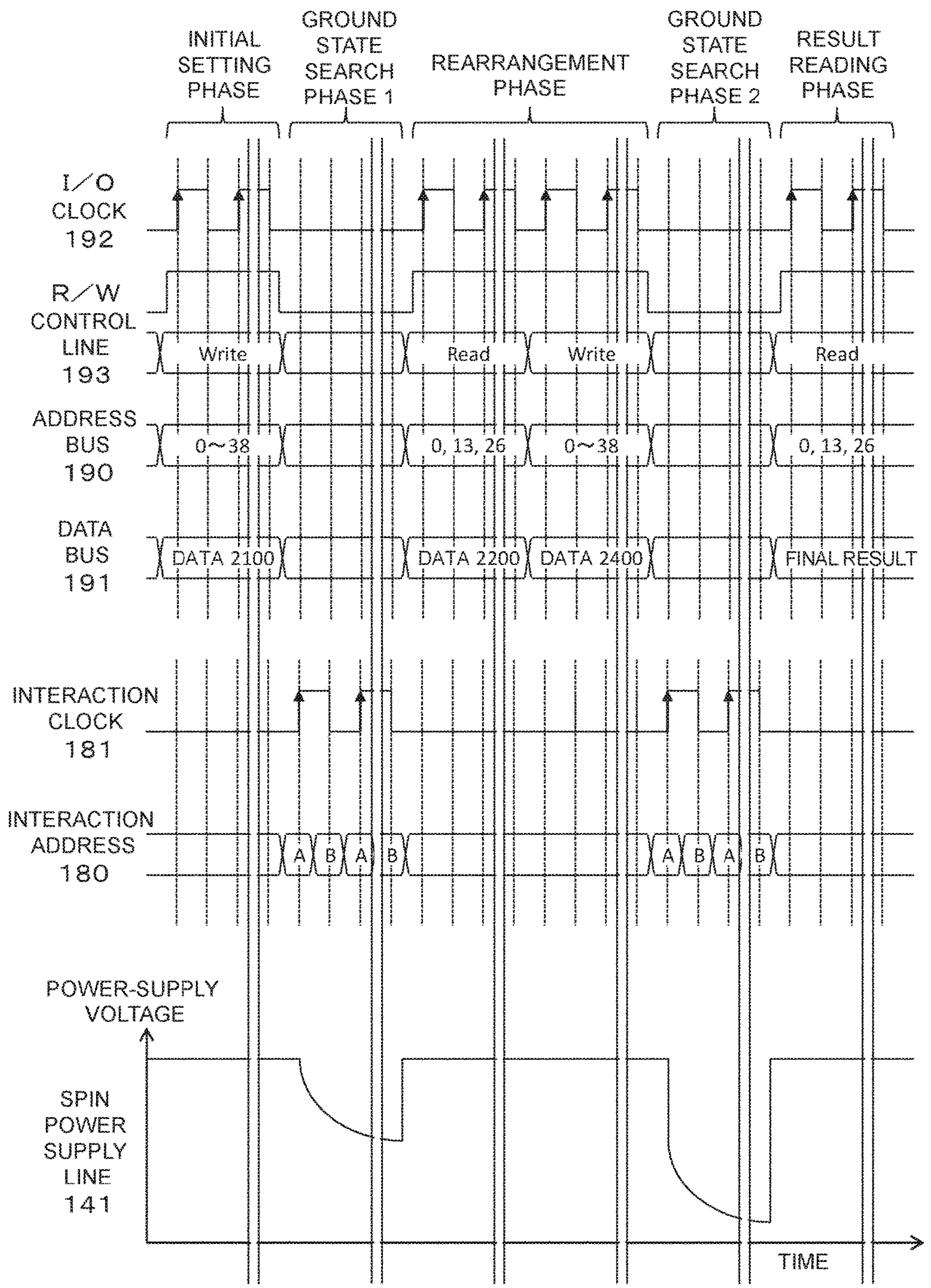
FIG. 27 is a time chart showing an example of operations of an Ising chip.

A time chart in the case of controlling the Ising chip 100 according to the procedure shown in FIG. 7 is shown in FIG. 27.

First, in an initial setting phase, operations corresponding to Step S704 are performed. At this time, the SRAM-compatible interface 150 is controlled to write the data 2100. The voltage supplied to the spin power supply line 141 is a sufficient voltage to hold the storage in the memory cell.

Subsequently, in a ground state search phase 1, operations corresponding Steps S705 to S708 are performed. At this time, the interaction control interface 160 is controlled to alternately perform interactions in the group A and the group B. In parallel with this, the power-supply voltage supplied to the spin power supply line 141 is gradually lowered. Thus, ground state search is carried out.

At an intermediate point during the ground state search, there is a rearrangement phase where the correspondence between the spin unit 300 on the Ising chip 100 and the spin in the Ising model to be solved is changed. The rearrangement phase corresponds to Steps S709 to S710. When entering into the rearrangement phase, the power-supply voltage on the spin power supply line 141 lowered during the ground state search is returned to the original voltage. This is for causing behavior equivalent to that of a normal memory, in order to read from and write to memory cells that express spins in the rearrangement phase. In the rearrangement phase, the values of the spins are read out once (reading of the data 2200) and new data (data 2400) generated on the basis of another spin allocation map is written.

Subsequently, in a ground state search phase 2, the ground state search is continued, with control similar to the ground state search phase 1. At this time, the voltage on the spin power supply line 141 may take over the voltage value at the end of the ground state search phase 1, or may start again from the initial voltage (sufficient voltage to hold the storage in the memory cells).

Finally, in a result reading phase, the values of the spins after the completion of the ground state search are read out (corresponding to Step S712). By the foregoing operations, the Ising chip 100 of the invention can search for a ground state of an Ising model that is provided (for example, FIG. 14) and can acquire an answer such as FIG. 15 (spin arrangement in the ground state) to the problem of FIG. 14.

REFERENCE SIGNS LIST

100, 100-1, 100-2 Ising chip
110 spin array
120 I/O driver

130 I/O address decoder
140 interaction address decoder
141 spin power supply line
142 normal power supply line
150 SRAM-compatible interface
160 interaction control interface
180 interaction address
181 interaction clock
190 address bus (SRAM-compatible interface)
191 data bus (SRAM-compatible interface)
192 I/O clock (SRAM-compatible interface)
193 R/W control line (SRAM-compatible interface)
200 information processing device
210 CPU
220 RAM
230 system bus
240 NIC
250 Ising chip controller
260 HDD
290 inter-device network
300 spin unit
410, 902, 1930 bit line
420, 901, 1920 word line
1900 memory cell
1950 pass-gate transistor
1960 data holding unit
N memory cell expressing a spin, and interface for outputting the value of a spin
IS0 memory cell indicating whether the external magnetic field coefficient is 0 or not
IS1 memory cell indicating +1/−1 of the external magnetic field coefficient
IU0, IL0, IR0, ID0, IF0 memory cell indicating whether the interaction coefficient is 0 or not
IU1, IL1, IR1, ID1, IF1 memory cell indicating +1/−1 of the interaction coefficient

The invention claimed is:

1. A semiconductor device comprising:

a spin array in which a spin unit is formed, the spin unit including a memory cell storing a value of one spin in an Ising model, a memory cell storing an interaction coefficient from an adjacent spin interacting with the spin, a memory cell storing an external magnetic field coefficient of the one spin, and a circuit deciding a next state of the one spin by binary majority decision logic based on a product of the value of each of the adjacent spins and the corresponding interaction coefficient, and the external magnetic field coefficient, the spin array being formed by having a plurality of the spin units, each having each spin in the Ising model allocated thereto, arranged and connected on a two-dimensional plane on a semiconductor substrate in a state where a topology of the Ising model is maintained.

2. The semiconductor device according to claim 1, wherein the memory cell storing the value of the one spin forming the spin unit is made up of a 1-bit memory which expresses a binary value, and wherein the memory cell storing the external magnetic field coefficient of the one spin forming the spin unit, and memory cell storing the interaction coefficient from the adjacent spin interacting with the one spin, are made up of a set of two 1-bit memory cells, each expressing a ternary value.

3. The semiconductor device according to claim 1, wherein a dedicated power supply line is connected to the memory cell storing the value of the spin provided in each spin unit arranged in the spin array, the dedicated power supply line being discriminated from a power supply line which supplies power to the other memory cells and the circuit, and wherein in each spin unit, control to lower a power-supply voltage supplied to the memory cell storing the value of the spin via the dedicated power supply line is performed at a time of executing processing of deciding a next state of the spin.

4. The semiconductor device according to claim 1, wherein an interaction control interface is connected to each spin unit arranged in the spin array, and wherein the spin units having the adjacent spins in the interacting relation allocated respectively are divided into separate groups, and to each of the grouped spin units, a signal line for inputting a signal that enables processing of deciding a next state of the spin to all the spin units belonging to each group is connected.

5. The semiconductor device according to claim 4, wherein the grouped spin units are further divided into subdivision groups according to power consumption for simultaneous execution, and a signal line for inputting a signal that enables processing of deciding a next state of the spin to all the spin units belonging to each of the subdivision groups is connected.

6. The semiconductor device according to claim 1, wherein the spin array formed by having a plurality of the spin units, each having each spin in the Ising model allocated thereto, arranged and connected on the two-dimensional plane on the semiconductor substrate in the state where the topology of the Ising model is maintained, is configured in such a way that, as each spin unit arranged in the spin array, each spin unit having a spin of each lattice vertex allocated thereto is arranged on the semiconductor substrate, with each lattice vertex in a lattice vertex arrangement in a Z-axis direction being inserted between each space in a lattice vertex arrangement in an X-axis direction, and with a lattice vertex arrangement in a Y-axis direction being a similar arrangement, as a method for arranging each lattice vertex of an Ising model of a three-dimensional lattice on the two-dimensional plane, and with the respective spin units being wire-connected to each other in a state where the topology of the three-dimensional lattice is maintained.

7. The semiconductor device according to claim 1, wherein the memory cell includes a data holding unit made up of two CMOS inverters, and a pass-gate transistor.

8. An information processing device comprising a Central Processing Unit (CPU), a Random Access Memory (RAM), a Hard Disk Drive (HDD), and the semiconductor device according to claim 1, connected to a system bus, wherein the CPU is configured to:

generate an interaction coefficient and an external magnetic field coefficient of the Ising model which expresses a target problem;

decide allocation of each spin in the Ising model to the spin units in the spin array on the semiconductor device;

randomly generate an initial spin arrangement;

write the initial spin arrangement, the interaction coefficient and the external magnetic field coefficient into the spin units in the spin array on the semiconductor device with each spin in the Ising model allocated thereto;

execute ground state search processing on the spin units that are grouped, repeatedly a predetermined number of times; and read out the spin arrangement of the spin unit that has reached a ground state, and thus acquire a solution to the target problem.

9. An information processing device comprising a Central Processing Unit (CPU), a Random Access Memory (RAM), a Hard Disk Drive (HDD), and a semiconductor device applicable as an accelerator, connected to a system bus, wherein the semiconductor device includes:

a spin array in which a spin unit is formed, the spin unit including a memory cell storing a value of one spin in an Ising model, a memory cell storing an interaction coefficient from an adjacent spin interacting with the spin, a memory cell storing an external magnetic field coefficient of the one spin, and a circuit deciding a next state of the one spin by binary majority decision logic based on a product of the value of each of the adjacent spins and the corresponding interaction coefficient, and the external magnetic field coefficient, the spin array being formed by having a plurality of the spin units, each having each spin in the Ising model allocated thereto, arranged and connected on a two-dimensional plane on a semiconductor substrate in a state where a topology of the Ising model is maintained;

an I/O interface which reads from and writes into the memory cells of the spin units arranged in the spin array; and an interaction control interface which supplies a signal enabling an interaction, for each group, to the spin units that are grouped, wherein the CPU is configured to generate an interaction coefficient and an external magnetic field coefficient of the Ising model which expresses a target problem;

decide allocation of each spin in the Ising model to the spin units in the spin array on the semiconductor device;

randomly generate an initial spin arrangement;

write the initial spin arrangement, the interaction coefficient and the external magnetic field coefficient into the spin units in the spin array on the semiconductor device with each spin in the Ising model allocated thereto;

execute ground state search processing on the spin units that are grouped, repeatedly a predetermined number of times; and read out the spin arrangement of the spin unit that has reached a ground state, and thus acquire a solution to the target problem.

10. The information processing device according to claim 8, wherein the step in which the CPU is configured to execute the ground state search processing on the spin units that are grouped, repeatedly a predetermined number of times, comprises the steps of:

setting an address for selecting a group of the spin units;

generating a clock for causing an interaction of the spin units of the selected group;

performing control to lower a voltage supplied to a power supply line connected to the memory cell storing the value of the spin of the spin units, following a schedule; and executing the processing repeatedly the predetermined number of times, sequentially changing the group to be selected.

11. The information processing device according to claim 8, wherein the CPU is further configured to generate a plurality of different allocation maps from each other, of each spin in the Ising model to the spin units in the spin array on the semiconductor device;

write the initial spin arrangement, the interaction coefficient and the external magnetic field coefficient to the spin units according to a first allocation map;

execute ground state search processing on the spin units that are grouped, repeatedly the predetermined number of times;

read out and records the spin arrangement of the spin units;

employ the recorded spin arrangement as a new initial spin arrangement of allocated spin units according to a next allocation map to be applied;

regenerate an interaction coefficient and an external magnetic field coefficient of the Ising model, and writes the initial spin arrangement, the interaction coefficient and the external magnetic field coefficient into the spin units; and execute ground state search processing on the spin units that are grouped, repeatedly the predetermined number of times, according to the new allocation map.

12. The information processing device according to claim 9, wherein the step in which the CPU is configured to execute the ground state search processing on the spin units that are grouped, repeatedly a predetermined number of times, comprises the steps of:

setting an address for selecting a group of the spin units;

generating a clock for causing an interaction of the spin units of the selected group;

performing control to lower a voltage supplied to a power supply line connected to the memory cell storing the value of the spin of the spin units, following a schedule; and executing the processing repeatedly the predetermined number of times, sequentially changing the group to be selected.

13. The information processing device according to claim 9, wherein the CPU is further configured to generate a plurality of different allocation maps from each other, of each spin in the Ising model to the spin units in the spin array on the semiconductor device;

write the initial spin arrangement, the interaction coefficient and the external magnetic field coefficient to the spin units according to a first allocation map;

execute ground state search processing on the spin units that are grouped, repeatedly the predetermined number of times;

read out and records the spin arrangement of the spin units;

employ the recorded spin arrangement as a new initial spin arrangement of allocated spin units according to a next allocation map to be applied;

regenerate an interaction coefficient and an external magnetic field coefficient of the Ising model, and writes the initial spin arrangement, the interaction coefficient and the external magnetic field coefficient into the spin units; and execute ground state search processing on the spin units that are grouped, repeatedly the predetermined number of times, according to the new allocation map.

* * * * *